(12) United States Patent
Kim et al.

(10) Patent No.: US 12,389,746 B2
(45) Date of Patent: Aug. 12, 2025

(54) DISPLAY APPARATUS

(71) Applicant: Samsung Display Co., Ltd., Yongin-Si (KR)

(72) Inventors: Hyangyul Kim, Yongin-si (KR);
Youngtae Kim, Yongin-si (KR);
Hyangki Sung, Yongin-si (KR);
Heeseong Jeong, Yongin-si (KR);
Sangmin Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 703 days.

(21) Appl. No.: 17/584,141

(22) Filed: Jan. 25, 2022

(65) Prior Publication Data

US 2022/0320249 A1 Oct. 6, 2022

(30) Foreign Application Priority Data

Apr. 1, 2021 (KR) .................... 10-2021-0042814

(51) Int. Cl.
*H10K 59/121* (2023.01)
*H10K 59/122* (2023.01)
*H10K 59/131* (2023.01)
*H10K 59/35* (2023.01)
*H10K 59/80* (2023.01)

(52) U.S. Cl.
CPC ......... *H10K 59/121* (2023.02); *H10K 59/122* (2023.02); *H10K 59/131* (2023.02); *H10K 59/353* (2023.02); *H10K 59/8051* (2023.02); *H10K 59/80515* (2023.02)

(58) Field of Classification Search
CPC .. H10K 59/121; H10K 59/122; H10K 59/123; H10K 59/131; H10K 59/353; H10K 59/8051; H10K 59/80515
See application file for complete search history.

(56) References Cited

U.S. PATENT DOCUMENTS 9,029,886 B2  5/2015  Namkung et al.
9,140,838 B2  9/2015  Lee et al.
9,263,506 B2  1/2016  Kim
(Continued)

FOREIGN PATENT DOCUMENTS

KR        10-1659121 B1    9/2016
KR     10-2018-0030365 A   3/2018
(Continued)

*Primary Examiner* — Meiya Li
(74) *Attorney, Agent, or Firm* — Innovation Counsel LLP

(57) ABSTRACT

A display apparatus includes: a conductive layer including a wire having a first edge and a second edge and extending in a first direction and a conductive pattern arranged outside the first edge of the wire; an organic insulating layer including a hole that overlaps the conductive pattern; a display element electrically connected to the conductive pattern through the hole, and including a pixel electrode, an emission layer, and an opposite electrode; and a pixel-defining layer covering an edge of the pixel electrode, overlapping the wire, and including an opening in which the emission layer is arranged, wherein the opening is divided by the wiring into a first area overlapping an outer side of the first edge of the wire and a second area overlapping an outer side of the second edge of the wire in a plan view, and the second area is larger than the first area.

20 Claims, 15 Drawing Sheets

(56) References Cited

U.S. PATENT DOCUMENTS

| | | |
|---|---|---|
| 9,575,721 B2 | 2/2017 | Lee et al. |
| 9,727,178 B2 | 8/2017 | Matsuyuki et al. |
| 10,529,792 B2 | 1/2020 | Kim et al. |
| 10,734,452 B1 | 8/2020 | Kim et al. |
| 2019/0115404 A1* | 4/2019 | Moon .................. H10K 59/879 |
| 2020/0199149 A1 | 6/2020 | Choe et al. |
| 2020/0312941 A1* | 10/2020 | Na ......................... H10K 50/10 |
| 2020/0411620 A1 | 12/2020 | Kwon et al. |
| 2020/0411628 A1 | 12/2020 | Na et al. |
| 2021/0036094 A1 | 2/2021 | Hong et al. |

FOREIGN PATENT DOCUMENTS

| | | |
|---|---|---|
| KR | 10-2018-0128545 A | 12/2018 |
| KR | 10-2060622 B1 | 12/2019 |
| KR | 10-2020-0115944 A | 10/2020 |

\* cited by examiner

DISPLAY APPARATUS

CROSS-REFERENCE TO RELATED APPLICATION

This application is based on and claims priority under 35 U.S.C. § 119 to Korean Patent Application No. 10-2021-0042814, filed on Apr. 1, 2021, in the Korean Intellectual Property Office, the disclosure of which is incorporated by reference herein in its entirety.

BACKGROUND

1. Field

The technical field relates to a display apparatus.

2. Description of the Related Art

When an image displayed by a display apparatus is viewed, colors in the image may change depending on a polar angle at which the image is viewed. An organic light-emitting display apparatus includes an organic light-emitting diode as a display element, the organic light-emitting diode may have a structure in which an emission layer is arranged between a pixel electrode and an opposite electrode. Due to this structure, a color of an imaged displayed by the display apparatus viewed from the front of the display apparatus may be different from a color of the image viewed from the lateral side of the display apparatus. As an example, the display apparatus may include a red organic light-emitting diode that emits red light, a green organic light-emitting diode that emits green light, and a blue organic light-emitting diode that emits blue light. Depending on positions and shapes of the red organic light-emitting diode, the green organic light-emitting diode, and the blue organic light-emitting diode, a part of an image viewed from the front of the display apparatus is white, but the part of the image viewed from the lateral side of the display apparatus may show such as red, blue, and/or green.

SUMMARY

Embodiments may be related a display apparatus. A color difference between a part of an image displayed the display apparatus viewed from the front of the display apparatus and a part of the image viewed from a lateral side of the display apparatus is reduced or minimized.

According to one or more embodiments, a display apparatus includes a substrate, a conductive layer arranged over the substrate and including a wire and a conductive pattern, the wire having a first edge and a second edge and extending in a first direction, and the conductive pattern being arranged outside the first edge of the wire, an organic insulating layer arranged on the conductive layer and including a hole that overlaps the conductive pattern, a display element arranged on the organic insulating layer, electrically connected to the conductive pattern through the hole, and including a pixel electrode, an emission layer, and an opposite electrode, and a pixel-defining layer covering an edge of the pixel electrode, overlapping the wire, and including an opening in which the emission layer is arranged, wherein the opening is divided by the wire into a first area and a second area in a plan view of the display apparatus, the first area overlapping an outer side of the first edge of the wire, and the second area overlapping an outer side of the second edge of the wire, and the second area is larger than the first area.

The display apparatus may further include a thin-film transistor arranged between the substrate and the conductive layer, and a lower organic insulating layer arranged between the thin-film transistor and the conductive layer and including a lower hole that overlaps at least a portion of the thin-film transistor, wherein the conductive pattern may be electrically connected to the thin-film transistor through the lower hole.

The hole may be adjacent to the lower hole in the first direction.

The hole may be adjacent to the lower hole in a second direction, the second direction is perpendicular to the first direction.

A distance from an upper surface of the substrate to an upper surface of the organic insulating layer may be at least partially reduced in a direction away from the conductive pattern, and the pixel electrode may be arranged along a shape of the upper surface of the organic insulating layer.

The opening may include a first opening and a second opening,

The conductive pattern may include a first conductive pattern and a second conductive pattern, the first conductive pattern being adjacent to the first opening, and the second conductive pattern being adjacent to the second opening, and the first conductive pattern and the second conductive pattern may be arranged in a second direction, the second direction is perpendicular to the first direction.

The second conductive pattern may be arranged between the first opening and the second opening.

The opening may further include a third opening, the emission layer may include a first emission layer, a second emission layer, and a third emission layer, the first emission layer emitting red light and overlapping the first opening, the second emission layer emitting green light and overlapping the second opening, and the third emission layer emitting blue light and overlapping the third opening, the conductive pattern may further include a third conductive pattern adjacent to the third opening and arranged with the second conductive pattern in the second direction, and the third conductive pattern may be at least partially arranged between the second opening and the third opening.

A distance between a center of the wire to a center of the opening may be 3 μm or more in a second direction, the second direction is perpendicular to the first direction.

The wire may include a data line.

According to one or more embodiments, a display apparatus includes a substrate, a lower organic insulating layer arranged over the substrate and including a lower hole, a conductive layer arranged on the lower organic insulating layer and including a wire and a conductive pattern, the wire including a first edge and a second edge and extending in a first direction, and the conductive pattern being arranged outside the first edge of the wire, overlapping the lower hole, and extending to an upper surface of the lower organic insulating layer from the lower hole, an organic insulating layer arranged on the conductive layer and including a hole overlapping the conductive pattern, a display element arranged on the insulating layer, electrically connected to the conductive pattern through the hole, and including a pixel electrode, an emission layer, and an opposite electrode, and a pixel-defining layer covering an edge of the pixel electrode, overlapping the wire, and including an opening in which the emission layer is arranged, wherein the opening is divided by the wire into a first area and a second area in a plan view of the display apparatus, the first area overlapping an outer side of the first edge of the wire, and the second area overlapping an outer side of the second edge of the wire, and the second area is larger or smaller than the first area.

The second area may be larger than the first area.

The second area may be smaller than the first area.

The display apparatus may further include a thin-film transistor arranged between the substrate and the lower organic insulating layer and overlapping at least a portion of the lower hole, and the conductive pattern may be electrically connected to the thin-film transistor through the lower hole.

The hole may be adjacent to the lower hole in the first direction.

The hole may be adjacent to the lower hole in a second direction, the second direction is perpendicular to the first direction.

The opening may include a first opening, a second opening, and a third opening, the emission layer may include a first emission layer, a second emission layer, and a third emission layer, the first emission layer emitting red light and overlapping the first opening, the second emission layer emitting green light and overlapping the second opening, and the third emission layer emitting blue light and overlapping the third opening, the conductive pattern may include a first conductive pattern, a second conductive pattern, and a third conductive pattern, the first conductive pattern being adjacent to the first opening, the second conductive pattern being adjacent to the second opening, and the third conductive pattern being adjacent to the third opening, the first conductive pattern, the second conductive pattern, and the third conductive pattern may be arranged in a second direction, the second direction is perpendicular to the first direction, the second conductive pattern may be arranged between the first opening and the second opening, and the third conductive pattern may be at least partially arranged between the second opening and the third opening.

The conductive layer may further include an intermediate wire extending in the first direction between the conductive pattern and the wire.

One of the wire and the intermediate wire may include a power line, and the other of the wire and the intermediate wire may include a data line.

The wire may include a data line.

DETAILED DESCRIPTION

Figure 1:
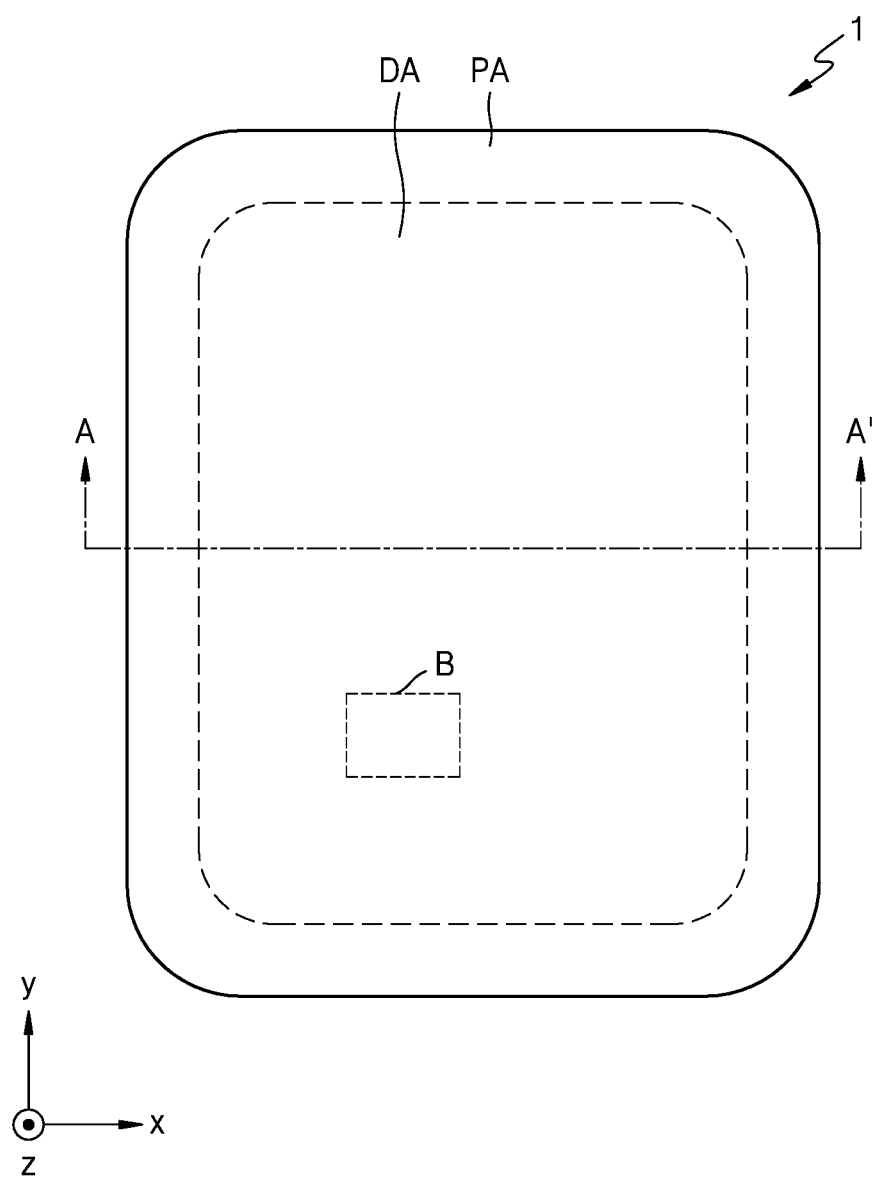
FIG. 1 is a plan view of a display apparatus according to an embodiment.

Example embodiments are described with reference to the accompanying drawings, wherein like reference numerals may refer to like elements. The embodiments may have different forms and should not be construed as being limited to the description.

Although the terms "first," "second," etc. may be used to describe various items, the items should not be limited by these terms. These terms are used to distinguish one item from another. A first item may be termed a second item without departing from teachings of one or more embodiments. The description of an item as a "first" item may not require or imply the presence of a second item or other items. The terms "first," "second," etc. may be used to differentiate different categories or sets of elements. For conciseness, the terms "first," "second," etc. may represent "first-category (or first-set)," "second-category (or second-set)," etc., respectively.

The singular forms "a," "an," and "the" may include the plural forms unless the context clearly indicates otherwise.

When a first element is referred to as being "on" second element, the first element can be directly or indirectly on the second element.

Dimensions in the drawings may be exaggerated or reduced for convenience of explanation.

When an embodiment may be implemented differently, a certain process order may be performed differently from the described order. For example, two consecutively described processes may be performed substantially at the same time or performed in an order opposite to the described order.

The term "connected" may mean "directly connected, "indirectly connected," "electrically connected," and/or "electrically connected through no intervening transistor." The term "insulate" may mean "electrically insulate" or "electrically isolate." The term "conductive" may mean "electrically conductive." The term "drive" may mean "operate" or "control." The term "include" may mean "be made of." A listing of items (e.g., materials) may mean at least one of the items (e.g., at least one of the materials." The expression/description that an element extends in a specified direction may mean that the lengthwise direction of the element is in the specified direction or parallel to the specified direction. The expression/description that a hole overlaps an object may mean that the position of the hole overlaps with the position of the object and/or the hole at least partially exposes the object.

FIG. 1 is a plan view of a display apparatus 1 according to an embodiment.

Referring to FIG. 1, the display apparatus 1 may include a display area DA and a peripheral area PA. The display area DA may display images according to input signals. A plurality of sub-pixels (not shown) may be arranged in the display area DA. The display area DA may display an image using light emitted from the plurality of sub-pixels.

The peripheral area PA may not display images. The peripheral area PA may surround at least a portion of the display area DA. The peripheral area PA may surround the entire display area DA. The peripheral area PA may surround only a portion of the display area DA. A driver may be arranged in the peripheral area PA and may provide electric signals or power to the sub-pixels.

Figure 2A:
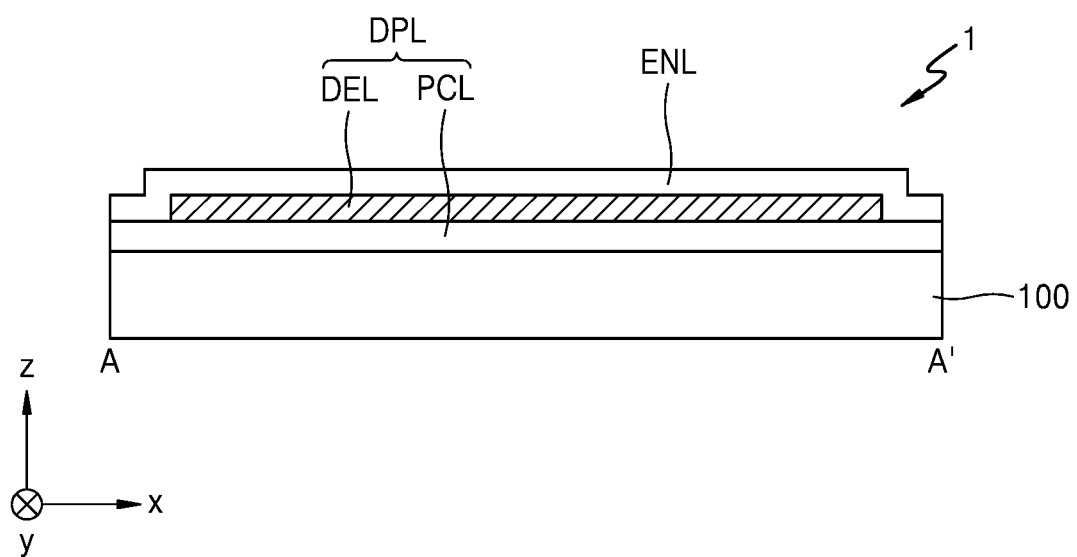
FIG. 2A is cross-sectional view of the display apparatus of FIG. 1, taken along line A-A' according to an embodiment.
Figure 2B:
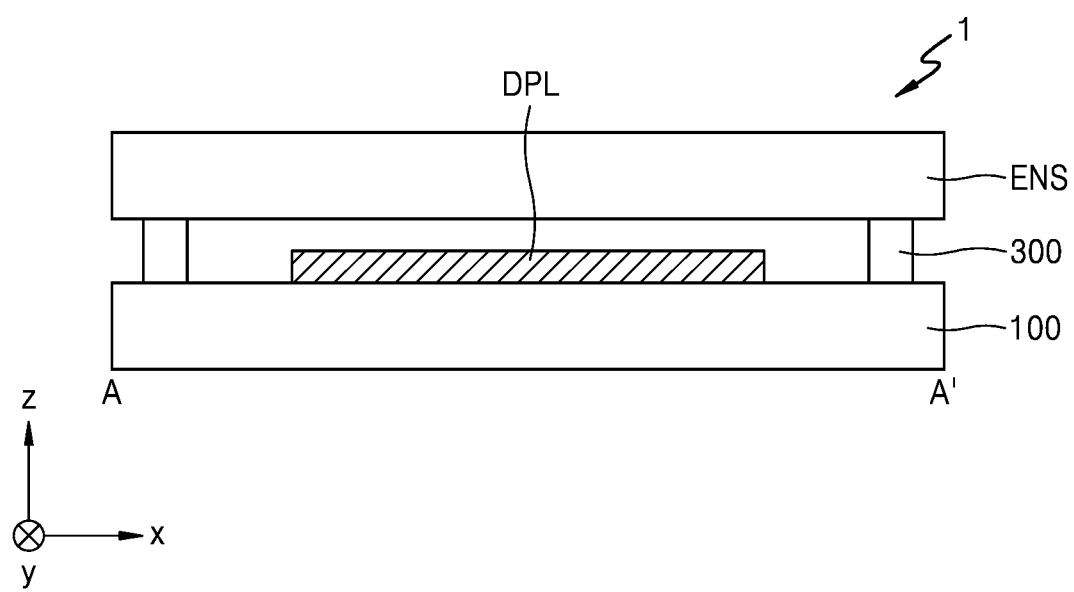
FIG. 2B is cross-sectional view of the display apparatus of FIG. 1 taken along line A-A' according to an embodiment.

FIGS. 2A and 2B are cross-sectional views of the display apparatus 1, taken along line A-A' according to one or more embodiments.

Referring to FIG. 2A, the display apparatus 1 may include a substrate 100, a display layer DPL, and an encapsulation layer ENL. The display layer DPL may include a pixel circuit layer PCL and a display element layer DEL, the pixel circuit layer PCL including a pixel circuit and an insulating layer, and the display element layer DEL including a plurality of display elements.

The substrate 100 may include glass or a polymer resin including at least one of polyethersulfone, polyarylate, polyetherimide, polyethylene naphthalate, polyethylene terephthalate, polyphenylene sulfide, polyimide, polycarbonate, cellulose tri acetate, and cellulose acetate propionate.

A barrier layer (not shown) may be provided between the pixel circuit layer PCL and the substrate 100. The barrier layer may prevent penetration of external substance and may include a single layer or a multi-layer structure including an inorganic material such as silicon nitride ($SiN_x$) and silicon oxide ($SiO_2$).

The pixel circuit layer PCL may be arranged on the substrate 100. The pixel circuit layer PCL may include a pixel circuit and an insulating layer, the pixel circuit being connected to a display element of the display element layer DEL. The pixel circuit layer PCL may include a plurality of thin-film transistors, a plurality of storage capacitors, and a plurality of insulating layers that insulate the plurality of thin-film transistors and the plurality of storage capacitors.

The display element layer DEL may be arranged on the pixel circuit layer PCL. The display element layer DEL may include display elements. In an embodiment, the display element may include an organic light-emitting diode including an emission layer. Alternatively, the display element may include a light-emitting diode LED. The size of the light-emitting diode LED may be at a microscale or nanoscale. The light-emitting diode may be a micro light-emitting diode. Alternatively, the light-emitting diode may be a nanorod light-emitting diode. The nanorod light-emitting diode may include gallium nitride (GaN). A color-converting layer may be arranged on the nanorod light-emitting diode. The color-converting layer may include quantum dots. Alternatively, the display element DPE may be a quantum-dot light-emitting diode including a quantum-dot emission layer. Alternatively, the display element may be an inorganic light-emitting diode including an inorganic semiconductor.

The display elements may be covered by an encapsulation member such as the encapsulation layer ENL. The encapsulation layer ENL may include at least one inorganic encapsulation layer and at least one organic encapsulation layer covering the display element layer DEL. The at least one inorganic encapsulation layer and the at least one organic encapsulation layer may be alternately stacked. The inorganic encapsulation layer may include at least one inorganic material, such as at least one of aluminum oxide ($Al_2O_3$), titanium oxide ($TiO_2$), tantalum oxide ($Ta_2O_5$), zinc oxide (ZnO), silicon oxide ($SiO_2$), silicon nitride ($SiN_x$), and silicon oxynitride (SiON). The organic encapsulation layer may include a polymer-based material. The polymer-based material may include at least one of an acryl-based resin, an epoxy-based resin, polyimide, and polyethylene. The organic encapsulation layer may include acrylate.

Referring to FIG. 2B, the display apparatus 1 may include a substrate 100, a display layer DPL, and an encapsulation substrate ENS. A sealing member 300 may be arranged between the substrate 100 and the encapsulation substrate ENS. The encapsulation substrate ENS may be a transparent member. The substrate 100 may be coupled to the encapsulation substrate ENS through the sealing member 300 such that an inner space between the substrate 100 and the encapsulation substrate ENS is sealed. In this case, a moisture absorbent or a filler may be arranged in the inner space. The sealing member 300 may be a sealant. In another embodiment, the sealing member 300 may include a material hardened by a laser. The sealing member 300 may include frit. The sealing member 300 may include at least one of a urethane-based resin, an epoxy-based resin, an acrylic resin, which are organic sealants, or silicon, which is an inorganic sealant. The urethane-based resin may include urethane acrylate. The acryl-based resin may include at least one of butylacrylate, ethylhexyl acrylate, etc. The sealing member 300 may include a material hardened by heat.

The display layer DPL may be covered by the encapsulation layer ENL of FIG. 2A or covered by the encapsulation substrate ENS and the sealing member 300 of FIG. 2B.

Though not shown, a touch electrode layer may be arranged on the encapsulation layer ENL and/or the encapsulation substrate ENS. An optical functional layer may be arranged on the touch electrode layer. The touch electrode layer may obtain coordinate information corresponding to an external input, for example, a touch event. The optical functional layer may reduce the reflectivity of light (e.g., external light) incident toward the display apparatus 1. The optical functional layer may improve color purity of light emitted from the display apparatus 1. The optical functional layer may include a retarder and/or a polarizer. The retarder may include a film-type retarder or a liquid crystal-type retarder. The retarder may include a $\lambda/2$ retarder and/or a $\lambda/4$ retarder. The polarizer may include a film-type polarizer or a liquid crystal-type polarizer. The film-type polarizer may include a stretchable synthetic resin film, and the liquid crystal-type polarizer may include liquid crystals arranged in a predetermined arrangement. Each of the retarder and the polarizer may further include a protective film.

The optical functional layer may include a black matrix and color filters. The color filters may correspond to colors of light respectively emitted from sub-pixels of the display apparatus 1. The color filters may each include red, green, or blue pigment or dye. Alternatively, the color filters may each include quantum dots in addition to the pigment or dye. Alternatively, some of the color filters may include no pigment or dye and may include scattering particles such as titanium oxide.

The optical functional layer may include a destructive interference structure. The destructive interference structure may include a first reflection layer and a second reflection layer respectively arranged on different layers. First-reflected light and second-reflected light respectively reflected by the first reflection layer and the second reflection layer may create destructive-interference and thus the reflectivity of external light may be reduced.

An adhesive member may be arranged between the touch electrode layer and the optical functional layer. The adhesive member may be a general adhesive member known in the art. The adhesive member may be a pressure sensitive adhesive (PSA).

Figure 3:
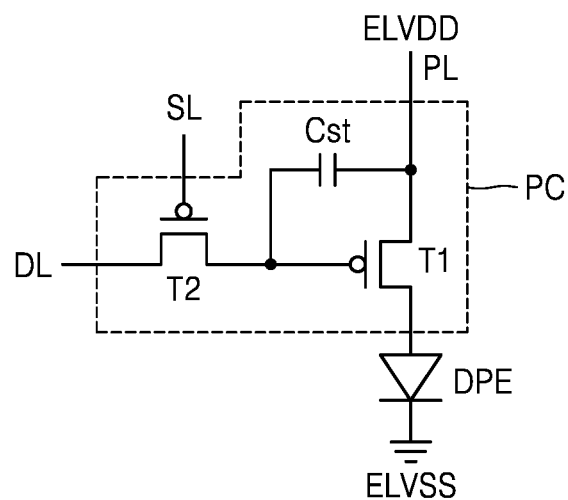
FIG. 3 is an equivalent circuit diagram of a pixel circuit according to an embodiment.

FIG. 3 is an equivalent circuit diagram of a pixel circuit PC according to an embodiment.

Referring to FIG. 3, the pixel circuit PC may be electrically connected to the display element DPE. The pixel circuit PC may include a driving thin-film transistor T1, a switching thin-film transistor T2, and a storage capacitor Cst.

The switching thin-film transistor T2 may be connected to a scan line SL and a data line DL and may transfer a data signal (or a data voltage) to the driving thin-film transistor T1 based on a scan signal (or a switching voltage) input from the scan line SL, the data signal (or the data voltage being) transmitted by the data line DL. The storage capacitor Cst may be electrically connected to the switching thin-film transistor T2 and a driving voltage line PL and may store a voltage corresponding to a difference between a voltage transferred from the switching thin-film transistor T2 and a first power voltage ELVDD supplied to the driving voltage line PL.

The driving thin-film transistor T1 may be electrically connected to the driving voltage line PL and the storage capacitor Cst and may control a driving current flowing from the driving voltage line PL to the display element DPE according to the voltage stored in the storage capacitor Cst. The display element DPE may emit light having a preset brightness according to the driving current. The opposite electrode of the display element DPE may receive a second power voltage ELVSS.

Though FIG. 3 shows that the pixel circuit PC includes two thin-film transistors and one storage capacitor, the pixel circuit PC may include three or more thin-film transistors.

Figure 4:
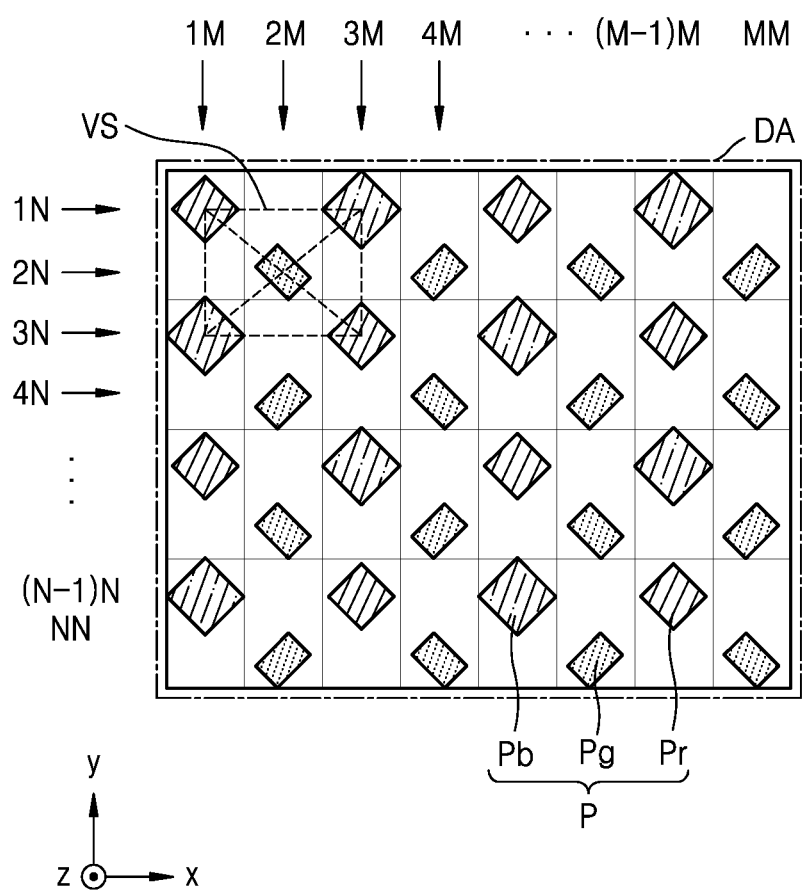
FIG. 4 is a layout diagram (or plan view) of a sub-pixel layout structure in a display area of a display apparatus according to an embodiment.

FIG. 4 is a layout diagram of a sub-pixel layout structure in the display area DA of the display apparatus 1 according to an embodiment.

Referring to FIG. 4, a plurality of sub-pixels P may be arranged in the display area DA. A sub-pixel is a minimum unit for implementing an image and denotes an emission area. When the organic light-emitting diode is employed as the display element, the emission area may be an opening of a pixel-defining layer.

A set of sub-pixels P may include a red sub-pixel Pr, a green sub-pixel Pg, and a blue sub-pixel Pb. In other word, a plurality of sub-pixels P may include a red sub-pixel Pr, a green sub-pixel Pg, and a blue sub-pixel Pb. The red sub-pixel Pr, the green sub-pixel Pg, and the blue sub-pixel Pb may respectively emit red light, green light, and blue light. A set of sub-pixels P may include a red sub-pixel Pr, a green sub-pixel Pg, a blue sub-pixel Pb, and a white sub-pixel. The red sub-pixel Pr, the green sub-pixel Pg, the blue sub-pixel Pb, and the white sub-pixel may respectively emit red light, green light, blue light, and white light.

The plurality of sub-pixels P arranged in the display area DA may be arranged in a PENTILE™ structure. A plurality of red sub-pixels Pr and a plurality of blue sub-pixels Pb may be alternately arranged in a first row 1N, a plurality of green sub-pixels Pg may be spaced from each other with a preset interval in a second row 2N adjacent to the first row 1N, blue sub-pixels Pb and red sub-pixels Pr may be alternately arranged in a third row 3N adjacent to the second row 2N, and a plurality of green sub-pixels Pg may be spaced from each other with a preset interval in a fourth row 4N adjacent to the third row 3N. The sub-pixel arrangement is repeated up to an (N−1)-th row (N−1)N and an N-th row NN. The blue sub-pixel Pb and the red sub-pixel Pr may be larger than the green sub-pixel Pg.

The plurality of red sub-pixels Pr arranged on the first row 1N and the plurality of green sub-pixels Pg arranged on the second row 2N may be alternately arranged with each other. Red sub-pixels Pr and blue sub-pixels Pb may be alternately arranged in a first column 1M, a plurality of green sub-pixels Pg may be spaced from each other with a preset interval in a second column 2M adjacent to the first column 1M, blue sub-pixels Pb and red sub-pixels Pr may be alternately arranged in a third column 3M adjacent to the second column 2M, and a plurality of green sub-pixels Pg may be spaced from each other in a fourth column 4M adjacent to the third column 3M. Such sub-pixel arrangement is repeated up to an (M−1)-th column (M−1)M and an M-th column MM.

In the pixel arrangement structure, red sub-pixels Pr are arranged on first and third vertexes among the vertexes of a virtual quadrangle VS with a green sub-pixel Pg centered at the center of the quadrangle, and blue sub-pixels Pb are arranged on second and fourth vertexes. The virtual quadrangle VS may be a rectangle, a rhombus, or a square.

The green sub-pixel Pg may have long sides and short sides. A long side of the green sub-pixel Pg may be opposite one side of the blue sub-pixel Pb. A short side of the green sub-pixel Pg may be opposite one side of the red sub-pixel Pr.

In the PENTILE™ structure, a color of a pixel is shared with its adjacent pixels, such that a high resolution may be obtained via a small number of pixels.

FIG. 4 illustrates that the plurality of sub-pixels P are arranged in a PENTILE™ matrix structure. The plurality of sub-pixels P may be arranged in one or more of a stripe structure, a mosaic arrangement structure, and a delta arrangement structure.

Figure 5:
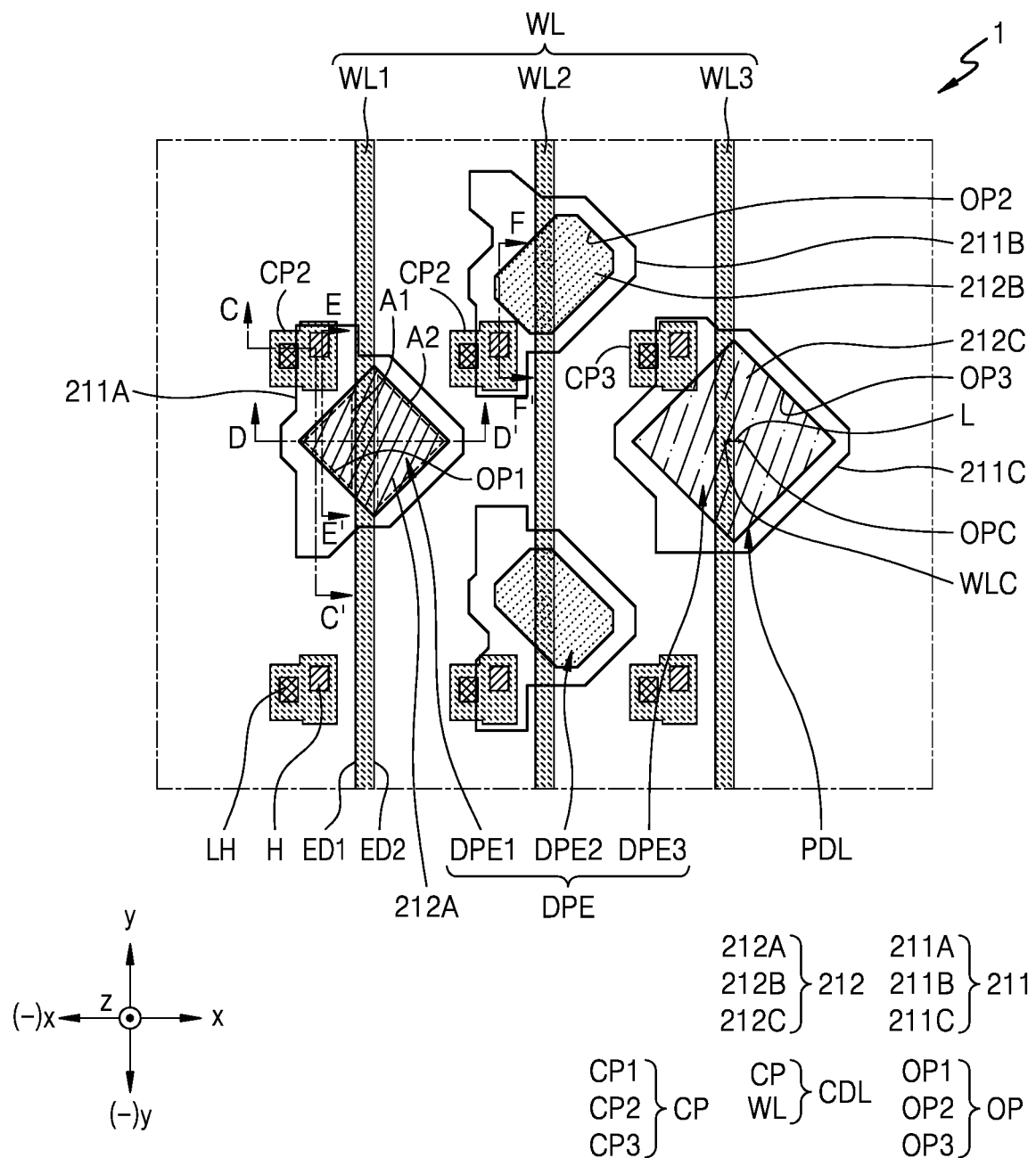
FIG. 5 is an enlarged plan view of a region B of the display apparatus of FIG. 1 according to an embodiment.

FIG. 5 is an enlarged plan view of a region B of the display apparatus 1 of FIG. 1 according to an embodiment.

Referring to FIG. 5, the display apparatus 1 may include a conductive layer CDL and the display elements DPE. The conductive layer CDL may include a wire WL and a conductive pattern CP. The conductive pattern CP may be a conductive member.

The wire WL may extend in the first direction. In FIG. 5, the first direction may be a y-direction and/or a (−) y-direction. In the display apparatus 1, the wire WL may be provided in a plurality. The wire WL may include a first wire WL1, a second wire WL2, and a third wire WL3. The first wire WL1, the second wire WL2, and the third wire WL3 may be spaced from each other in an x-direction and/or a (−) x-direction, i.e., a second direction perpendicular to the first direction.

The wire WL may have a first edge ED1 and a second edge ED2. The first edge ED1 may be opposite the second edge ED2. The first edge ED1 may be an edge in the (−) x-direction from the center WLC of the wire WL. Alternatively, the first edge ED1 may be an edge of the wire WL that faces the conductive pattern CP. The second edge ED2 may be an edge in the x-direction from the center WLC of the wire WL. The center WLC of the wire WL may be arranged between the first edge ED1 and the second edge ED2. The first edge ED1 and the second edge ED2 may extend in the first direction (e.g., the y-direction or the (−) y-direction) substantially. At least one of the first edge ED1 and the second edge ED2 may be curved or bent.

The wire WL may be or include a signal line. The wire WL may be or include a data line DL (see FIG. 3) configured to transfer a data signal. The wire WL may be or include a power line. The wire WL may be or include a power line configured to transfer a second power voltage ELVSS (see FIG. 3).

The conductive pattern CP may be configured to transfer an electric signal to the display element DPE. The conductive pattern CP may at least partially overlap a pixel electrode 211 of the display element DPE and may be electrically connected to the pixel electrode 211. Accordingly, the conductive pattern CP may transfer an electric signal to the display element DPE. The conductive pattern CP may be arranged outside or spaced from the wire WL. The conductive pattern CP may be arranged outside or spaced from the first edge ED1 of the wire WL.

The conductive pattern CP may be provided in a plurality to the display apparatus 1. The conductive pattern CP may include a first conductive pattern CP1, a second conductive pattern CP2, and a third conductive pattern CP3. The first conductive pattern CP1 may be arranged outside the first wire WL1. The second conductive pattern CP2 may be arranged outside the second wire WL2. The third conductive pattern CP3 may be arranged outside the third wire WL3. The plurality of conductive patterns CP may be arranged in the second direction (e.g., the x-direction or the (−) x-direction). The first conductive pattern CP1 and the second conductive pattern CP2 may be arranged or aligned in the second direction (e.g., the x-direction or the (−) x-direction). The second conductive pattern CP2 and the third conductive pattern CP3 may be arranged or aligned in the second direction (e.g., the x-direction or the (−) x-direction). The first conductive pattern CP1, the second conductive pattern CP2, and the third conductive pattern CP3 may be arranged or aligned in the second direction (e.g., the x-direction or the (−) x-direction).

The conductive pattern CP and the wire WL may be arranged in the same conductive layer CDL. A lower organic insulating layer (not shown) may be arranged below the conductive layer CDL including the conductive pattern CP and the wire WL. An organic insulating layer (not shown) may be arranged on the conductive layer CDL. The conductive layer CDL may be arranged between the lower organic insulating layer and the organic insulating layer.

The conductive pattern CP may overlap a hole H of the organic insulating layer. At least a portion of a conductive pattern CP may be exposed by a hole H (or contact hole H) of the organic insulating layer (IL shown in FIG. 6). The corresponding display element DPE may be arranged on the organic insulating layer. The conductive pattern CP may be electrically connected to the display element DPE arranged on the organic insulating layer through the hole H. The conductive pattern CP may be electrically connected to the pixel electrode 211 of the display element DPE through the hole H. The hole H may be provided in a plurality in the organic insulating layer. The plurality of holes H may be arranged or aligned in the second direction (e.g., the x-direction or the (−) x-direction). The plurality of holes H may be arranged or aligned in the first direction (e.g., the y-direction or the (−) y-direction). Accordingly, alignment between the plurality of conductive patterns CP and the plurality of holes H may be easy. The plurality of holes H may respectively overlap the plurality of conductive patterns CP. The plurality of holes H may respectively overlap or partially expose the first conductive pattern CP1, the second conductive pattern CP2, and the third conductive pattern CP3.

Figure 6:
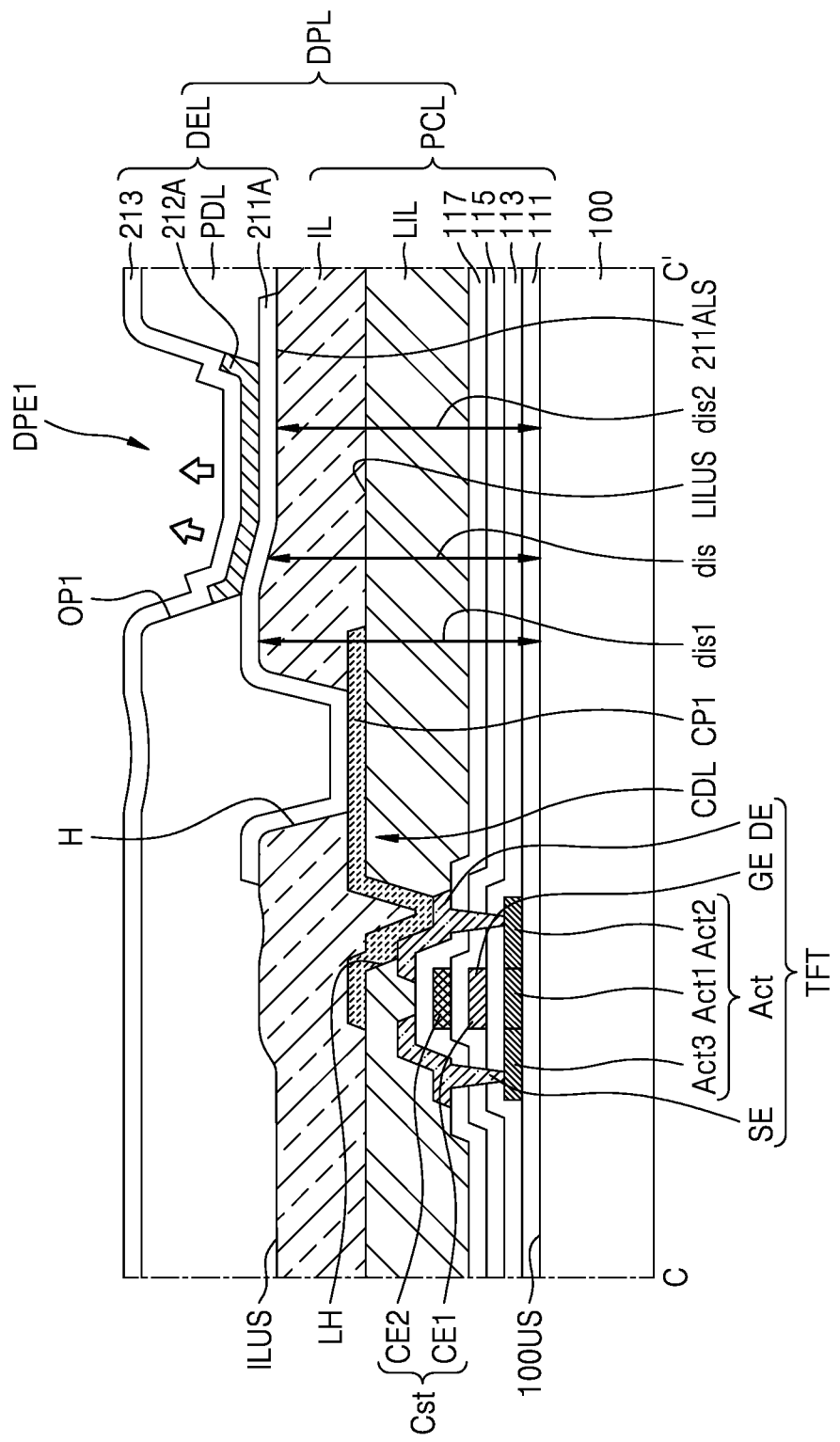
FIG. 6 is a cross-sectional view of the display apparatus of FIG. 5, taken along line C-C' according to an embodiment.

The conductive pattern CP may overlap or cover a lower hole LH (or connection hole LH) of the lower organic insulating layer (LIL shown in FIG. 6). The conductive pattern CP may be electrically connected to a thin-film transistor arranged below the lower organic insulating layer through the lower hole LH. The lower hole LH may be provided in a plurality in the lower organic insulating layer. The plurality of lower holes LH may be arranged or aligned in the second direction (e.g., the x-direction or the (−) x-direction). The plurality of lower holes LH may be arranged or aligned in the first direction (e.g., the y-direction or the (−) y-direction). Accordingly, alignment between the plurality of conductive patterns CP and the plurality of lower holes LH may be easy. The plurality of lower holes LH may respectively overlap the plurality of conductive patterns CP or be covered by the plurality of conductive patterns CP. The plurality of lower holes LH may respectively overlap the first conductive pattern CP1, the second conductive pattern CP2, and the third conductive pattern CP3 or be covered by the first conductive pattern CP1, the second conductive pattern CP2, and the third conductive pattern CP3.

A hole H may be adjacent to and spaced from a corresponding lower hole LH in the second direction (e.g., the x-direction or the (−) x-direction) in a plan view (e.g., an xy-plan view) of the display apparatus. The hole H and the corresponding lower hole LH may be adjacent to each other in the second direction (e.g., the x-direction or the (−) x-direction) in a plan view (e.g., an xy-plan view) of the display apparatus. The hole H and the corresponding lower hole LH may be surrounded by the perimeter of the corresponding conductive pattern CP in a plan view (e.g., an xy-plan view) of the display apparatus. In a plan view (e.g., an xy-plan view) of the display apparatus, the hole H of an organic insulating layer IL may be apart from the lower hole LH of a lower organic insulating layer LIL.

A display element DPE may emit light. The display element DPE may be an organic light-emitting diode. The display element DPE may be electrically connected to the corresponding conductive pattern CP through the corresponding hole H. The display element DPE may be provided in a plurality. The plurality of display elements DPE may be electrically connected to the plurality of conductive patterns, respectively. The plurality of display elements DPE may include a first display element DPE1, a second display element DPE2, and a third display element DPE3. The first display element DPE1, the second display element DPE2, and the third display element DPE3 may be electrically connected to the first conductive pattern CP1, the second conductive pattern CP2, and the third conductive pattern CP3, respectively. The first display element DPE1 may include a red organic light-emitting diode that emits red light. The second display element DPE2 may include a green organic light-emitting diode that emits green light. The third display element DPE3 may include a blue organic light-emitting diode that emits blue light. The red organic light-emitting diode, the green organic light-emitting diode, and the blue organic light-emitting diode may be arranged in a PENTILE™ structure. The third display element DPE3 may be spaced from the first display element DPE1 in the x-direction of FIG. 5.

The display element DPE may overlap the wire WL. The plurality of display elements DPE may respectively overlap the plurality of wires WL. The first display element DPE1, the second display element DPE2, and the third display element DPE3 may respectively overlap the first wire WL1, the second wire WL2, and the third wire WL3.

The display element DPE may include the pixel element 211, an emission layer 212, and an opposite electrode (213 shown in FIG. 6). The pixel electrode 211 may include a first pixel electrode 211A, a second pixel electrode 211B, and a third pixel electrode 211C. The emission layer 212 may include a first emission layer 212A, a second emission layer 212B, and a third emission layer 212C. The first pixel electrode 211A, the first emission layer 212A, and a portion of the opposite electrode may be included in the first display element DPE1. The second pixel electrode 211B, the second emission layer 212B, and a portion of the opposite electrode may be included in the second display element DPE2. The third pixel electrode 211C, the third emission layer 212C, and a portion of the opposite electrode may be included in the third display element DPE3.

The pixel electrode 211 may overlap the wire WL. The pixel electrode 211 may extend from the corresponding wire WL to a corresponding conductive pattern CP. The pixel electrode 211 may have a similar shape with respect to the second direction (e.g., the x-direction or the (−) x-direction). The pixel electrode 211 may include a first portion and a second portion each extending in a direction from a center WLC of the wire WL to the first edge ED1 of the wire WL, the first portion overlapping the corresponding conductive pattern CP, and the second portion not overlapping the corresponding conductive pattern CP. In other words, the pixel electrode 211 may include a first portion and a second portion positioned at opposite sides of the corresponding wire WL.

The pixel electrode 211 may overlap at least a portion of the conductive pattern CP and may be electrically connected to the conductive pattern CP through the hole H of the organic insulating layer. The first pixel electrode 211A may overlap the first conductive pattern CP1 and may be electrically connected to the first conductive pattern CP1. The second pixel electrode 211B may overlap the second conductive pattern CP2 and may be electrically connected to the second conductive pattern CP2. The third pixel electrode 211C may overlap the third conductive pattern CP3 and may be electrically connected to the third conductive pattern CP3.

The pixel-defining layer PDL may be arranged on the organic insulating layer and the pixel electrode 211. The pixel-defining layer PDL may cover the edges of the pixel electrode 211. The pixel-defining layer PDL may cover edges of the first pixel electrode 211A and edges of the second pixel electrode 211B, and edges of the third pixel electrode 211C.

The pixel-defining layer PDL may include an opening OP overlapping the wire WL. The opening OP may expose at least a portion of the pixel electrode 211. An emission layer 212 may be arranged in the opening OP. The opening OP may define an emission area of the display element DPE. In other words, the opening OP may define a sub-pixel.

An opening OP may be divided into a first area A1 and a second area A2 by a corresponding wire WL in a plan view of the display apparatus 1. The opening OP may include a first area A1 and a second area A2. The first area A1 may be a region of the opening OP that overlaps the outer side of the first edge ED1 of the wire WL. The first edge ED1 of the wire WL is positioned between the first area A1 of the opening OP and the second edge ED2 of the wire WL. The second area A2 may be a region of the opening OP that overlaps the outer side of the first edge ED2 of the wire WL. The second edge ED2 of the wire WL is positioned between the second area A2 and the first edge ED1 of the wire WL.

The first area A1 may be larger or smaller than the second area A2. In other words, the opening OP may be biased toward one side with respect to the center WLC of the wire WL. The opening OP may be asymmetric with respect to the center line of the wire WL. A center OPC of the opening OP may be spaced from the center WLC of the wire WL by a (minimum) distance L in the second direction (e.g., the x-direction or the (−) x-direction).

If the opening OP is accurately horizontally symmetric with respect to the wire WL, a difference between a color of a part of an image viewed from the front of the display apparatus 1 and a color of the part of the image viewed from the lateral side of the display apparatus 1 may be reduced. However, due to an alignment error of a process of manufacturing the display apparatus 1, the opening OP may not be accurately horizontally symmetric with respect to the wire WL. When the second opening OP2 is biased to the right with respect to the second wire WL2 and the third opening OP3 is biased to the left with respect to the third wire WL3, a color of the image part viewed from the right of the display apparatus 1 may be different from a color of the image part viewed from the left of the display apparatus 1. This phenomenon may be because the pixel electrode 211 is arranged on the wire WL to overlap the wire WL, and the pixel electrode 211 is inclined.

When the first area A1 is larger or smaller than the second area A2, the opening OP may be biased toward one side with respect to the center WLC of the wire WL. The plurality of openings OP may be biased to one side in the same direction with respect to the plurality of wires WL. Accordingly, even when an alignment error of a process of manufacturing the display apparatus 1 occurs, a color change between an image displayed by the display apparatus 1 viewed from different sides of the display apparatus 1 may be reduced. Particularly, a color changes of an image viewed in the (−) x-direction of FIG. 5 and in the x-direction of FIG. 5 may be reduced or minimized.

A distance L between the center WLC of the wire WL and the center OPC of the opening OP in the second direction (e.g., the x-direction or the (−) x-direction) may be 3 μm or more. Even when an alignment error (e.g., in a range from about −1.5 μm to about +1.5 μm) of a process of manufacturing the display apparatus 1 occurs, the plurality of openings OP may be biased to the same side with respect to the plurality of wires WL.

The second area A2 may be larger than the first area A1 in the plan view of the display apparatus 1. When the conductive pattern CP is arranged outside the first edge ED1 of the wire WL, the opening OP may be biased toward the outer side of the second edge ED2 of the wire WL. When the first edge ED1 of the wire WL is positioned between the conductive pattern CP and the second edge ED2 of the wire WL, the center OPC of the opening OP may be positioned between the center WLC of the wire WL and the first second edge ED2 of the wire WL. Due to the conductive pattern CP, a color change between an image displayed by the display apparatus 1 viewed from the front side and an image displayed by the display apparatus 1 viewed from the lateral side may be reduced. A color change between an image displayed by the display apparatus 1 viewed in the (−) y direction of FIG. 5 and viewed in the y direction of FIG. 5 may be reduced.

The opening OP may be provided in a plurality in the pixel-defining layer PDL. The opening OP may include a first opening OP1, a second opening OP2, and a third opening OP3.

The first opening OP1 may overlap with (and expose) the first wire WL1 and the first pixel electrode 211A. The first emission layer 212A may be arranged in the first opening OP1. The first emission layer 212A may emit red light, and the first opening OP1 may define an emission area of the first display element DPE1. That is, the first opening OP1 may define a red sub-pixel Pr (see FIG. 4).

The second opening OP2 may overlap with (and expose) the second wire WL2 and the second pixel electrode 211B. The second emission layer 212B may be arranged in the second opening OP2. The second emission layer 212B may emit green light, and the second opening OP2 may define an emission area of the second display element DPE2. That is, the second opening OP2 may define a green sub-pixel Pg (see FIG. 4).

The third opening OP3 may overlap with (and expose) the third wire WL3 and the third pixel electrode 211C. The third emission layer 212C may be arranged in the third opening OP3. The third emission layer 212C may emit blue light, and the third opening OP3 may define an emission area of the third display element DPE3. That is, the third opening OP3 may define a blue sub-pixel Pb (see FIG. 4).

The second conductive pattern CP2 may be arranged between the first opening OP1 and the second opening OP2. The center of the first opening OP1 may be spaced from the center of the second opening OP2 in a direction different from each of the first direction (e.g., the y-direction or the (−) y-direction) and the second direction (e.g., the x-direction or the (−) x-direction) in a plan view (e.g., the xy-plan view), and the second conductive pattern CP2 may be arranged between the center of the first opening OP1 and the center of the second opening OP2. The third conductive pattern CP3 may be substantially arranged between the second opening OP2 and the third opening OP3. The center of the second opening OP2 may be spaced from the center of the third opening OP3 in a direction different from each of the first direction (e.g., the y-direction or the (−) y-direction) and the second direction (e.g., the x-direction or the (−) x-direction) in a plan view (e.g., the xy-plan view), and the third conductive pattern CP3 may be arranged between the center of the second opening OP2 and the center of the third opening OP3. Accordingly, a color change between an image displayed by the display apparatus 1 viewed from the front side and an image displayed by the display apparatus 1 viewed from the lateral side due to the conductive pattern CP may be reduced.

Figure 7:
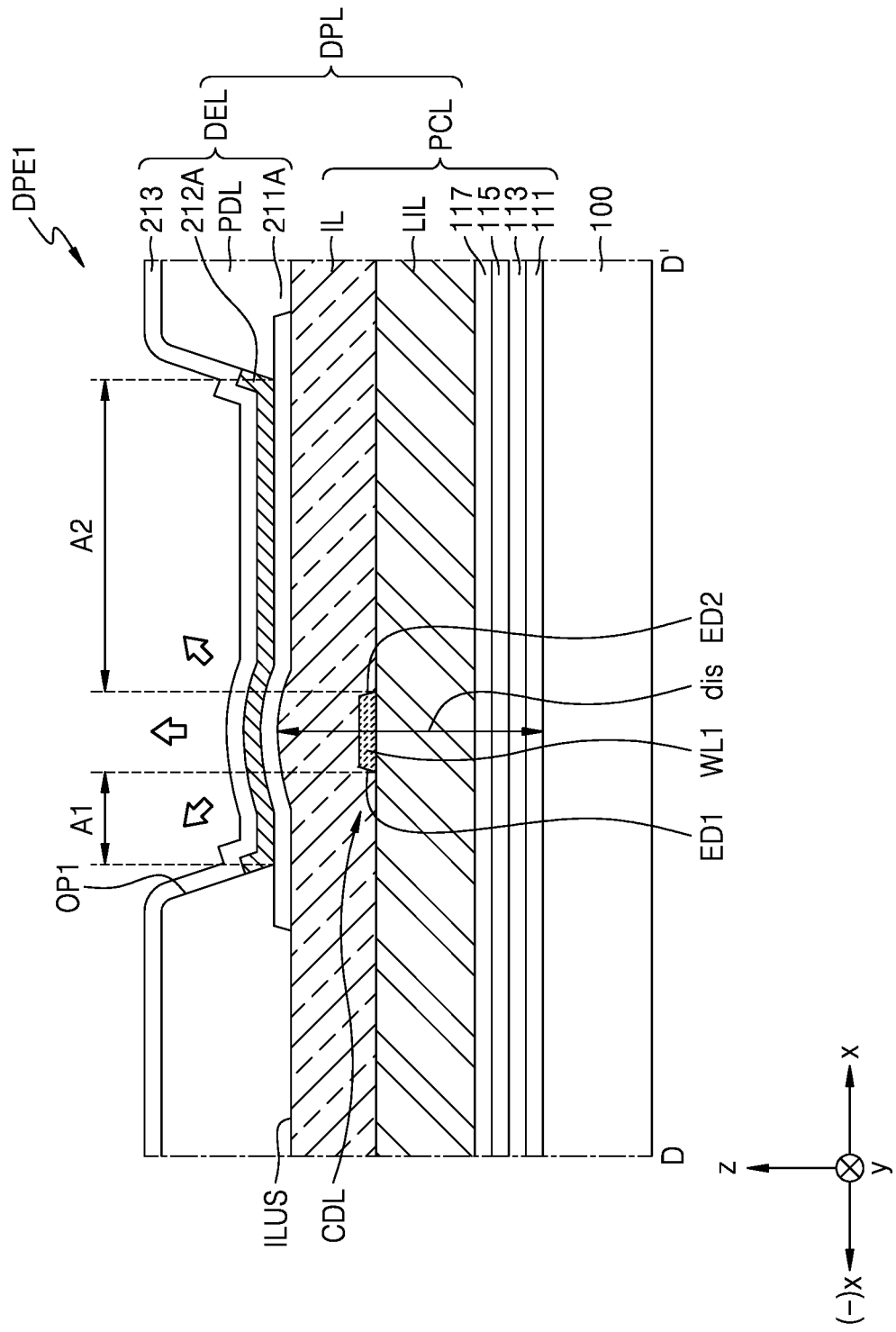
FIG. 7 is a cross-sectional view of the display apparatus of FIG. 5, taken along line D-D' according to an embodiment.
Figure 8:
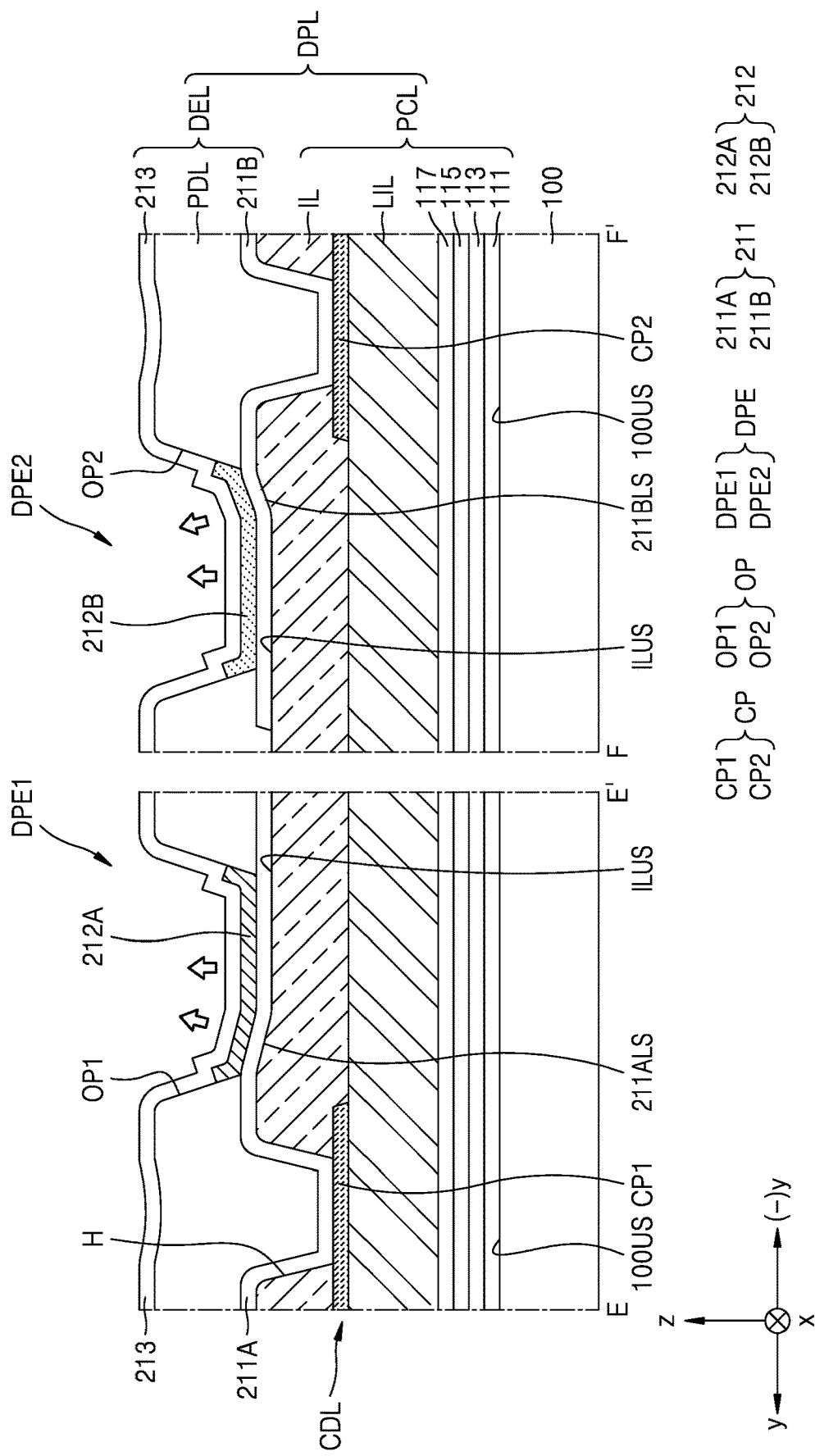
FIG. 8 is a cross-sectional view of the display apparatus of FIG. 5, taken along lines E-E' and F-F'.

FIG. 6 is a cross-sectional view of the display apparatus 1 of FIG. 5, taken along line C-C' according to an embodiment. FIG. 7 is a cross-sectional view of the display apparatus 1 of FIG. 5, taken along line D-D' according to an embodiment. FIG. 8 is a cross-sectional view of the display apparatus 1 of FIG. 5, taken along lines E-E' and F-F' according to an embodiment. In FIGS. 6 to 8, the same reference numerals as those of FIG. 2A may denote the same elements.

Referring to FIGS. 5, 6, 7, and 8, the display apparatus 1 may include the substrate 100 and the display layer DPL disposed on the substrate 100 in the z-direction. The display layer DPL may include the pixel circuit layer PCL and the display element layer DEL.

The pixel circuit layer PCL may be arranged on the substrate 100. The pixel circuit layer PCL may include a thin-film transistor TFT, a storage capacitor Cst, a buffer layer 111, a first gate insulating layer 113, a second gate insulating layer 115, an interlayer insulating layer 117, a lower organic insulating layer LIL, the conductive layer CDL, and an organic insulating layer IL.

The buffer layer 111 may be arranged on the substrate 100. The buffer layer 111 may include an inorganic insulating material such as silicon nitride ($SiN_x$), silicon oxynitride (SiON), and silicon oxide ($SiO_2$) and include a single layer or a multi-layer structure including an inorganic insulating layer.

The thin-film transistor TFT may include a semiconductor layer Act, a gate electrode GE, a drain electrode DE, and a source electrode SE. The semiconductor layer Act may be arranged on the buffer layer 111. The semiconductor layer Act may include polycrystalline silicon. Alternatively, the semiconductor layer Act may include amorphous silicon, an oxide semiconductor, or an organic semiconductor. The semiconductor layer Act may include a channel region Act1, a drain region Act2, and a source region Act3, the drain region Act2 and the source region Act3 being respectively arranged on two opposite sides of the channel region Act1.

The gate electrode GE may overlap the channel region Act1. The gate electrode GE may include a low-resistance metal material. The gate electrode GE may include a conductive material including molybdenum (Mo), aluminum (Al), copper (Cu), and titanium (Ti) and may have a single-layered structure or a multi-layered structure including the above materials.

The first gate insulating layer 113 may be arranged between the gate electrode GE and the semiconductor layer Act. The first gate insulating layer 113 may include an inorganic insulating material including silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$).

The second gate insulating layer 115 may cover the gate electrode GE. The second gate insulating layer 115 may be arranged on the gate electrode GE and the first gate insulating layer 113. Similar to the first gate insulating layer 113, the second gate insulating layer 115 may include an inorganic insulating material including silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide (ZnO).

An upper electrode CE2 of the storage capacitor Cst may be arranged on the second gate insulating layer 115. The upper electrode CE2 may overlap the gate electrode GE. The gate electrode GE and the upper electrode CE2 (insulated from each other by the second gate insulating layer 115) may constitute the storage capacitor Cst. The gate electrode GE may serve as a lower electrode CE1 of the storage capacitor Cst.

The storage capacitor Cst may overlap the thin-film transistor TFT. The storage capacitor Cst may not overlap the thin-film transistor TFT.

The upper electrode CE2 may include at least one of aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and copper (Cu) and may include a single layer or a multi-layer structure.

The interlayer insulating layer 117 may cover the upper electrode CE2. The interlayer insulating layer 117 may be arranged on the upper electrode CE2 and the second gate insulating layer 115. The interlayer insulating layer 117 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide (ZnO). The interlayer insulating layer 117 may include a single layer or a multi-layer structure.

The drain electrode DE and the source electrode SE may be arranged on the interlayer insulating layer 117. The drain electrode DE may be electrically connected to the drain region Act2 through a contact hole of the first gate insulating layer 113, the second gate insulating layer 115, and the interlayer insulating layer 117. The source electrode SE may be electrically connected to the source region Act3 through a contact hole of the first gate insulating layer 113, the second gate insulating layer 115, and the interlayer insulating layer 117. The drain electrode DE and the source electrode SE may include a conductive material including molybdenum (Mo), aluminum (Al), copper (Cu), and titanium (Ti) and have a single-layered structure or a multi-layered structure. The drain electrode DE and the source electrode SE may have a multi-layered structure of Ti—Al—Ti.

The lower organic insulating layer LIL may be arranged on the thin-film transistor TFT and the interlayer insulating layer 117. The lower organic insulating layer LIL may cover the thin-film transistor TFT and the interlayer insulating layer 117. An upper surface LILUS of the lower organic insulating layer LIL may be substantially flat. The lower organic insulating layer LIL may include an organic insulating material including a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend of some of the above polymers.

The lower organic insulating layer LIL may include the lower hole LH that overlaps with at least a portion of the thin-film transistor TFT. The lower hole LH may expose at least a portion of the thin-film transistor TFT. The lower hole LH may overlap with the source electrode SE or the drain electrode DE and expose the source electrode SE or the drain electrode DE. Alternatively, the lower hole LH may overlap a lower conductive pattern arranged below the lower organic insulating layer LIL and expose the lower conductive pattern.

The conductive layer CDL may be arranged on the lower organic insulating layer LIL. The conductive layer CDL may include the first wire WL1, the first conductive pattern CP1, and the second conductive pattern CP2. The first wire WL1, the first conductive pattern CP1, and the second conductive pattern CP2 may be arranged on the lower organic insulating layer LIL. The lower organic insulating layer LIL may be arranged between the thin-film transistor TFT and the conductive layer CDL. The second conductive pattern CP2 is similar to the first conductive pattern CP1.

The first conductive pattern CP1 may overlap the lower hole LH of the lower organic insulating layer LIL. The first conductive pattern CP1 may be electrically connected to the thin-film transistor TFT through the lower hole LH of the lower organic insulating layer LIL. The first conductive pattern CP1 may extend from the lower hole LH of the lower organic insulating layer LIL to the upper surface LILUS of the lower organic insulating layer LIL.

The organic insulating layer IL may be arranged on the conductive layer CDL. The organic insulating layer IL may be arranged on the conductive layer CDL and the lower organic insulating layer LIL. At least a portion of an upper surface ILUS of the organic insulating layer IL may be substantially flat. The organic insulating layer IL may include an organic insulating material including a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend of some of the polymers.

The organic insulating layer IL may cover the edge of the first conductive pattern CP1. The organic insulating layer IL may cover the edge of the second conductive pattern CP2. The organic insulating layer IL may cover the first wire WL1. A distance dis from an upper surface 100US of the substrate 100 to the upper surface ILUS of the organic insulating layer IL may be at least partially reduced in a direction away from the first conductive pattern CP1. A first distance dis1 from the upper surface 100US of the substrate 100 to the upper surface ILUS of the organic insulating layer IL in one region of the organic insulating layer IL that overlaps the first conductive pattern CP1 may be greater than a second distance dis2 from the upper surface 100US of the substrate 100 to the upper surface ILUS of the organic insulating layer IL in another region of the organic insulating layer IL that does not overlap the first conductive pattern CP1. Accordingly, the upper surface ILUS of the organic insulating layer IL may be curved along the shape of the first conductive pattern CP1. In addition, a distance dis from the upper surface 100US of the substrate 100 to the upper surface ILUS of the organic insulating layer IL may be at least partially reduced in a direction away from the wire WL. Accordingly, the upper surface ILUS of the organic insulating layer IL may be curved along the shape of the first wire WL1.

The organic insulating layer IL may include the hole H that overlaps with the first conductive pattern CP1. The hole H may expose at least a portion of the first conductive pattern CP1. The hole H of the organic insulating layer IL may not overlap with the lower hole LH of the lower organic insulating layer LIL in the thickness direction (i.e., the z-direction indicated in FIG. 5) of the substrate 100. The hole H of the organic insulating layer IL may be spaced from the lower hole LH of the lower organic insulating layer LIL in a lengthwise or widthwise direction of the substrate 100.

The display element layer DEL may be arranged on the pixel circuit layer PCL. The display element layer DEL may be arranged on the organic insulating layer IL. The display element layer DEL may include the first display element DPE1, the second display element DPE2, and the pixel-defining layer PDL. The first display element DPE1 may include a red organic light-emitting diode. The second display element DPE2 may include a green organic light-emitting diode. The first display element DPE1 may include the first pixel electrode 211A, the first emission layer 212A, and a portion of an opposite electrode 213. The second display element DPE2 may include the second pixel electrode 211B, the first emission layer 212B, and a portion of an opposite electrode 213. The second pixel electrode 211B and the second emission layer 212B are respectively similar to the first pixel electrode 211A and the first emission layer 212A.

The first display element DPE1 may be arranged on the organic insulating layer IL. The first display element DPE1 may be electrically connected to the first conductive pattern CP1 through the hole H of the organic insulating layer IL. The first pixel electrode 211A may overlap or cover the hole H of the organic insulating layer IL and be electrically connected to the first conductive pattern CP1. The first pixel electrode 211A may be electrically connected to the thin-film transistor TFT through the first conductive pattern CP1.

The first pixel electrode 211A may extend from the hole H of the organic insulating layer IL to the upper surface ILUS of the organic insulating layer IL. The first pixel electrode 211A may be arranged on or partially match the shape of the upper surface ILUS of the organic insulating layer IL. Accordingly, a distance from the upper surface 100US of the substrate 100 to a lower surface 211ALS of the first pixel electrode 211A that faces the upper surface 100US of the substrate 100 may be at least partially reduced in a direction away from the first conductive pattern CP1.

The first pixel electrode 211A may have a multi-layered structure of Ti—Al—Ti. Alternatively, the first pixel electrode 211A may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). The first pixel electrode 211A may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound or alloy of some of the above metals. The first pixel electrode 211A may further include a layer positioned on/under the reflective layer, the layer including ITO, IZO, ZnO, or $In_2O_3$.

The pixel-defining layer PDL may cover edges of the first pixel electrode 211A. The pixel-defining layer PDL may include an organic insulating material and/or an inorganic insulating material. The pixel-defining layer PDL may include a first opening OP1 that overlaps with the first wire WL1. Alternatively, the first opening OP1 may overlap with the first pixel electrode 211A and may expose the first pixel electrode 211A.

The first opening OP1 may be divided into the first area A1 and the second area A2 by the first wire WL1 in a plan view of the display apparatus 1. The first opening OP1 may include the first area A1 and the second area A2. The first area A1 may be a region of the first opening OP1 that overlaps the outer side of the first edge ED1 of the first wire WL1. The second area A2 may be a region of the first opening OP1 that overlaps the outer side of the second edge ED2 of the first wire WL1. The first area A1 of the first opening OP1 may abut the outer side of the first edge ED1 of the first wire WL1 in a plan view of the display apparatus 1. The second area A2 of the first opening OP1 may abut the outer side of the second edge ED2 of the first wire WL1 in the plan view of the display apparatus. The first area A1 may be smaller or larger than the area of the second area A2.

The first emission layer 212A may be arranged on the first pixel electrode 211A. The first emission layer 212A may be arranged inside the first opening OP1 of the pixel-defining layer PDL. The first emission layer 212A may overlap the first opening OP1 of the pixel-defining layer PDL. The first emission layer 212A may include a polymer organic material or a low-molecular weight organic material that emits light having a preset color.

The opposite electrode 213 may be arranged on the first emission layer 212A. The opposite electrode 213 may be arranged on both the first emission layer 212A and the pixel-defining layer PDL. The opposite electrode 213 may be provided as one body. The opposite electrode 213 may be shared by a plurality of display elements DPE. The portion of the opposite electrode 213 of the first display element DPE1 and the portion of the opposite electrode 213 of the second display element DPE2 may be portions of the same opposite electrode 213. The opposite electrode 213 may include a conductive material having a small work function. The opposite electrode 213 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy of some of the metals. The opposite electrode 213 may further include a layer positioned on the (semi) transparent layer including the above material, the layer including ITO, IZO, ZnO, or $In_2O_3$. At least one of a hole transport layer (HTL) and a hole injection layer (HIL) may be further provided between the pixel electrode 211 and the emission layer 212. At least one of an electron transport layer (ETL) and an electron injection layer (EIL) may be further provided between the emission layer 212 and the opposite electrode 213.

The lower surface 211ALS of the first pixel electrode 211A may have a shape inclined with respect to the upper surface 100US of the substrate 100. Therefore, the brightness of light emitted from the red organic light-emitting diode, i.e., the first display element DPE1, may be high not only in the front of the display apparatus 1 but also in a direction of a specific angle from the front of the display apparatus 1. Due to the first conductive pattern CP1, a color of an image displayed by the display apparatus 1 viewed from the front of the display apparatus 1 may be different from a color of an image displayed by the display apparatus 1 viewed from a lateral side of the display apparatus 1.

When the display apparatus 1 is viewed in the y-direction, brightness of light emitted from the red organic light-emitting diode (i.e., the first display element DPE1) may be relatively high, and brightness of light emitted from the green organic light-emitting diode (i.e., the second display element DPE2) may be relatively low. When the display apparatus 1 is viewed in the (−) y-direction, brightness of light emitted from the red organic light-emitting diode (e.g., the second display element DPE2) may be relatively low, and brightness of light emitted from the green organic light-emitting diode (i.e., the second display element DPE2) may be relatively high.

In an embodiment, the second area A2 may be larger or smaller than the first area A1. In this case, even when an alignment error between the first wire WL1 and the first opening OP1 occurs during a process of manufacturing the display apparatus, the first opening OP1 may be biased to one side with respect to the first wire WL1. In addition, the plurality of openings may be biased in the same direction with respect to the plurality of wires. Accordingly, a color change between an image displayed by the display apparatus viewed from the front side of the display apparatus and the image displayed by the display apparatus viewed from the lateral side of the display apparatus may be reduced. Particularly, a color change between an image displayed by the display apparatus viewed in the (−) x-direction of FIG. 7 and the image of the display apparatus viewed in the x-direction of FIG. 7 may be reduced.

When the second area A2 is larger than the first area A1, a distance from the first opening OP1 to the first conductive pattern CP1 may increase. Accordingly, the influence on the lower surface 211ALS of the first pixel electrode 211A by the first conductive pattern CP1 may be reduced. That is, an inclined angle of the lower surface 211ALS of the first pixel electrode 211A with respect to the upper surface 100US of the substrate 100 may be reduced. In addition, the influence on the lower surface 211BLS of the second pixel electrode 211B by the second conductive pattern CP2 may be reduced. That is, an inclined angle of the lower surface 211BLS of the second pixel electrode 211B with respect to the upper surface 100US of the substrate 100 may be reduced. A color change between an image displayed by the display apparatus 1 viewed from the front of the display apparatus 1 and the image displayed by the display apparatus 1 viewed from the lateral side of the display apparatus 1 due to the first conductive pattern CP1 and the second conductive pattern CP2 may be reduced.

Figure 9:
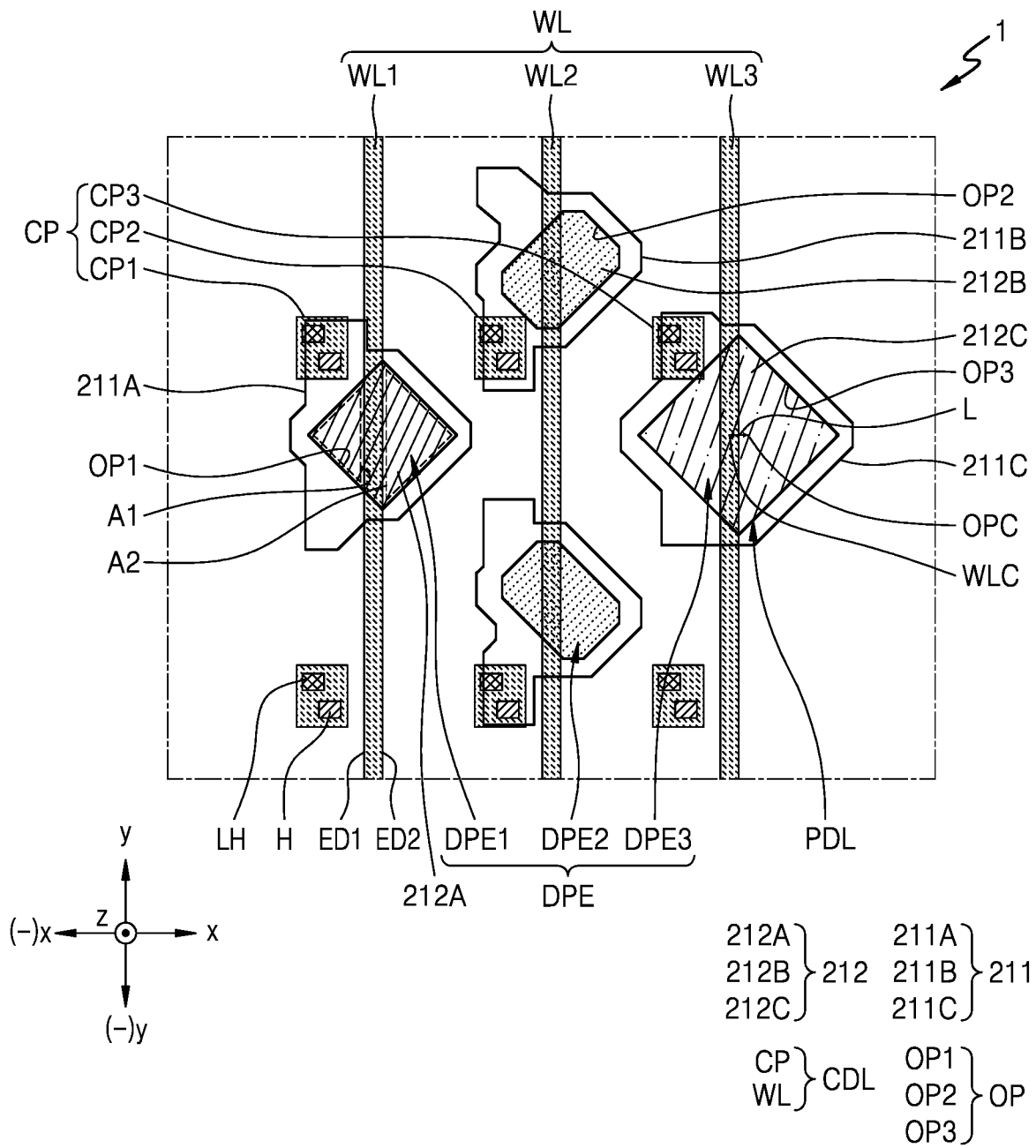
FIG. 9 is an enlarged plan view of a region B of the display apparatus of FIG. 1 according to an embodiment.

FIG. 9 is an enlarged plan view of a region B of the display apparatus 1 of FIG. 1 according to an embodiment.

In FIG. 9, the same reference numerals as those of FIG. 5 may denote the same or similar elements.

Referring to FIG. 9, the display apparatus 1 may include the conductive layer CDL and the display element DPE. The conductive layer CDL may include the wire WL and the conductive pattern CP.

In an embodiment, the hole H may be adjacent to the lower hole LH in the first direction (e.g., the y-direction or the (−) y-direction). The hole H may be spaced from a corresponding lower hole LH in the first direction (e.g., the y-direction or the (−) y-direction). In a plan view (e.g., a xy-plan view), the hole H may be adjacent to the lower hole LH in the first direction (e.g., the y-direction or the (−) y-direction). The hole H and the lower hole LH that overlap with one of the plurality of conductive patterns CP may be adjacent to each other in the first direction (e.g., the y-direction or the (−) y-direction). The hole H and the corresponding lower hole LH may overlap with a same conductive pattern CP. Accordingly, the width of the conductive pattern CP in the second direction (e.g., the x-direction or the (−) x-direction) may be reduced or minimized. A color change between an image displayed by the display apparatus 1 viewed from the front of the display apparatus 1 and the image displayed by the display apparatus 1 viewed from the lateral side of the display apparatus due to the conductive pattern CP may be reduced.

The opening OP may be divided into a first area A1 and a second area A2 by a corresponding wire WL. The opening OP may include the first area A1 and the second area A2. The first area A1 may be smaller or larger than the area of the second area A2. In an embodiment, the second area A2 may be larger than the first area A1. In another embodiment, the second area A2 may be smaller than the first area A1.

Figure 10:
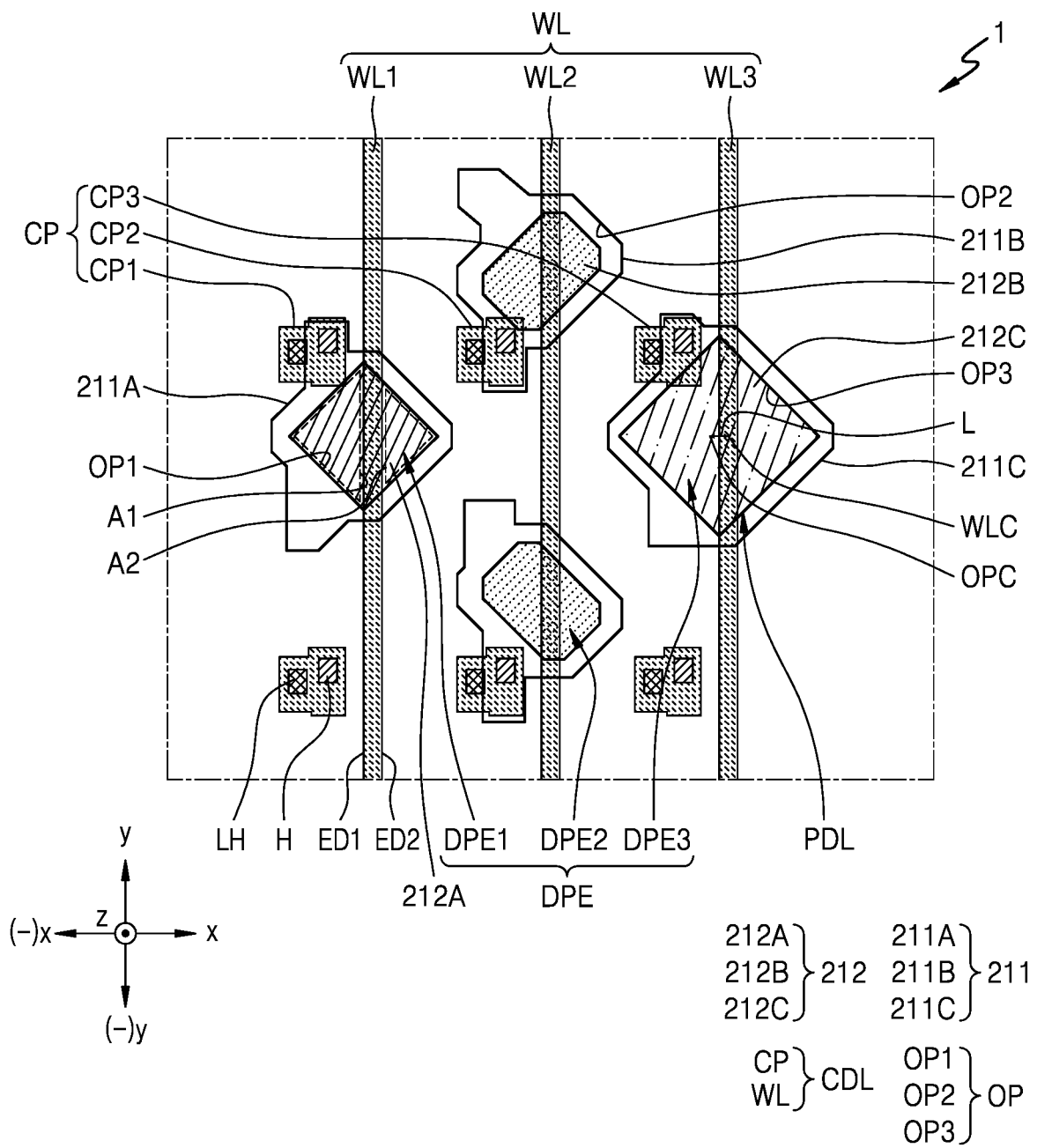
FIG. 10 is an enlarged plan view of a region B of the display apparatus of FIG. 1 according to an embodiment.

FIG. 10 is an enlarged plan view of a region B of the display apparatus 1 of FIG. 1 according to an embodiment. In FIG. 10, the same reference numerals as those of FIG. 5 may denote the same or similar elements.

Referring to FIG. 10, the display apparatus 1 may include the conductive layer CDL and the display element DPE. The conductive layer CDL may include the wire WL and the conductive pattern CP.

In an embodiment, the hole H may be adjacent to the lower hole LH in the second direction (e.g., the x-direction or the (−) x-direction). The hole H may be spaced from a corresponding lower hole LH in the second direction (e.g., the x-direction or (−) x-direction). In an embodiment, the hole H may be adjacent to the lower hole LH in the first direction (e.g., the y-direction or the (−) y-direction). The hole H may be spaced from a corresponding lower hole LH in the first direction (e.g., the y-direction or the (−) y-direction).

The pixel-defining layer PDL may include the opening OP that overlaps with the wire WL. The opening OP may expose the pixel electrode 211. The emission layer 212 may be arranged in the opening OP.

The opening OP may be divided into a first area A1 and a second area A2 by wire WL. The opening OP may include the first area A1 and the second area A2. The first area A1 may be a region of the opening OP that overlaps the outer side of the first edge ED1 of the wire WL. The second area A2 may be a region of the opening OP that overlaps the outer side of the second edge ED2 of the wire WL. The first area A1 may abut the outer side of the first edge ED1 of the wire WL. The second area A2 may abut the outer side of the second edge ED2 of the wire WL.

The first area A1 may be smaller or larger than the second area A2. In other words, the opening OP may be biased to one side with respect to the center WLC of the wire WL. Accordingly, even when an alignment error (e.g., in a range from about −1.5 μm to about +1.5 μm) of a process of manufacturing the display apparatus 1 occurs, a color change between an image displayed by the display apparatus 1 viewed from the front of the display apparatus 1 and the image display by the display apparatus 1 viewed from the lateral side of the display apparatus may be reduced or minimized. Particularly, a color change between an image displayed by the display apparatus 1 viewed in the (−) x direction of FIG. 10 and an image displayed by the display apparatus 1 viewed in the x direction of FIG. 10 may be reduced.

A distance L between the center WLC of the wire WL and the center OPC of the opening OP in the second direction (e.g., the x-direction or the (−) x-direction) may be 3 μm or more. Even when an alignment error (e.g., in a range from about −1.5 μm to about +1.5 μm) of a process of manufacturing the display apparatus 1 occurs, the plurality of openings OP may be biased to one side with respect to the plurality of wires WL.

The second area A2 may be smaller than the area of the first area A1. In the case where the conductive pattern CP is arranged outside the first edge ED1 of the wire WL, the opening OP may be biased toward or beyond the outer side of the first edge ED1 of the wire WL.

Figure 11A:
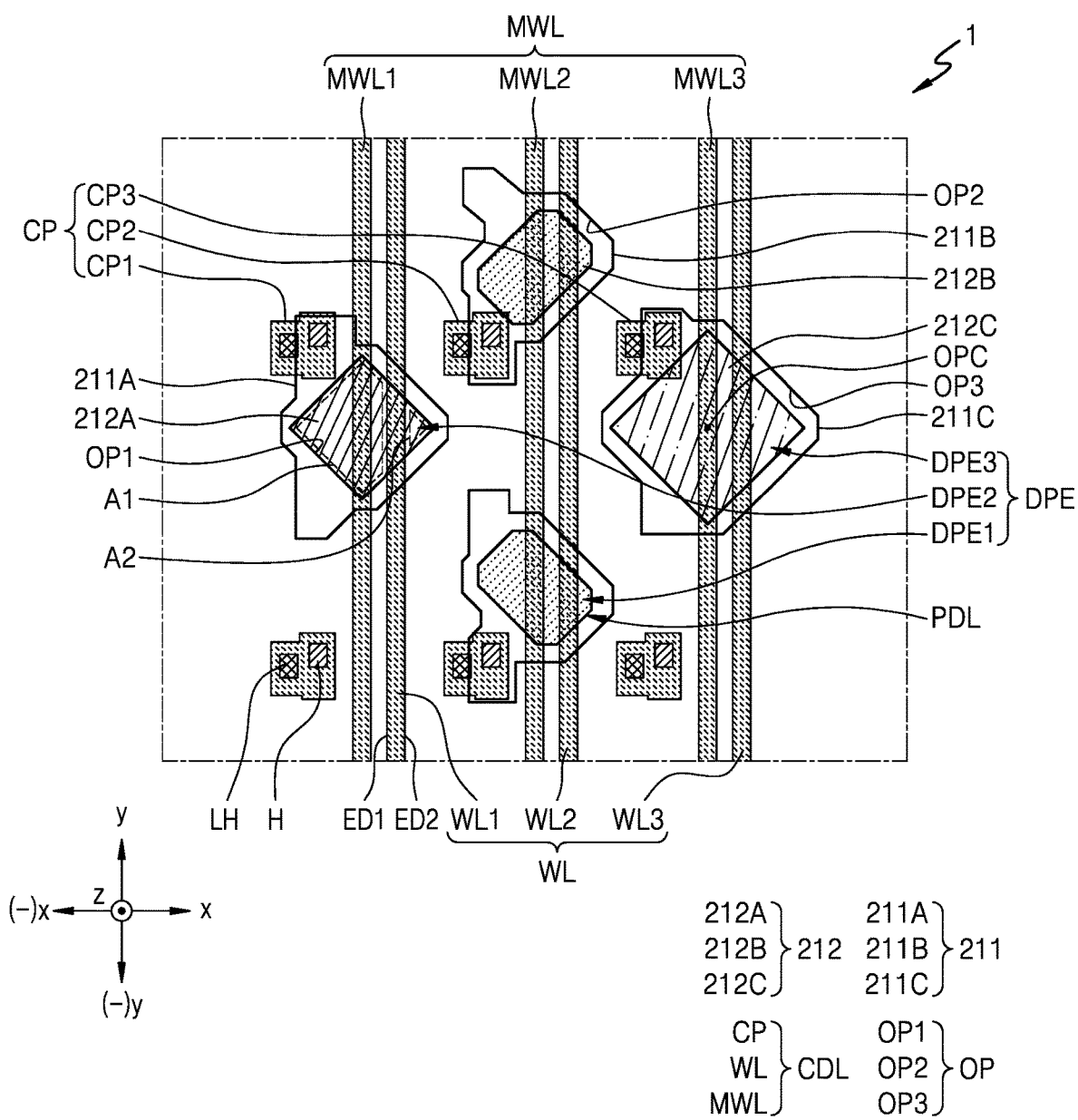
FIG. 11A is an enlarged plan view of a region B of the display apparatus of FIG. 1 according to an embodiment.

FIG. 11A is an enlarged plan view of a region B of the display apparatus 1 of FIG. 1 according to an embodiment. In FIG. 11A, the same reference numerals as those of FIG. 10 may denote the same or similar elements.

Referring to FIG. 11A, the display apparatus 1 may include the conductive layer CDL and the display element DPE. The conductive layer CDL may include the wire WL, an intermediate wire MWL, and the conductive pattern CP.

The intermediate wire MWL may extend in the first direction (e.g., the y-direction or the (−) y-direction). The intermediate wire MWL may be provided in a plurality in the display apparatus 1. The intermediate wire MWL may include a first intermediate wire MWL1, a second intermediate wire MWL2, and a third intermediate wire MWL3. The first intermediate wire MWL1, the second intermediate wire MWL2, and the third intermediate wire MWL3 may be spaced from another in the second direction (e.g., the x-direction or the (−) x-direction).

In an embodiment, the intermediate wire MWL may be arranged between the conductive pattern CP and the wire WL. As an example, the first intermediate wire MWL1 may be arranged between the first conductive pattern CP1 and the first wire WL1. The second intermediate wire MWL2 may be arranged between the second conductive pattern CP2 and the second wire WL2. The third intermediate wire MWL3 may be arranged between the third conductive pattern CP3 and the third wire WL3.

The intermediate wire MWL may overlap the center OPC of the opening OP. In an embodiment, the intermediate wire MWL may divide the opening OP into two halves. The first intermediate wire MWL1 may divide the first opening OP1 into two halves. The second intermediate wire MWL2 may divide the second opening OP2 into two halves. The third intermediate wire MWL3 may divide the third opening OP3 into two halves. Accordingly, a color change between an image displayed by the display apparatus 1 viewed from the front of the display apparatus 1 and of the image displayed by the display apparatus 1 viewed from the lateral side of the display apparatus 1 may be reduced or minimized.

One of the wire WL and the intermediate wire MWL may be a power line, and the other of the wire WL and the intermediate wire MWL may be a signal line. One of the wire WL and the immediately neighboring intermediate wire MWL may be a power line, and the other may be a signal line. As an example, the wire WL may be a power line. The wire WL may transfer the second power voltage ELVSS (see FIG. 3). The intermediate wire MWL may be the data line DL (see FIG. 3) configured to transfer a data signal. As another example, the wire WL may be the data line DL (see FIG. 3) configured to transfer a data signal. The intermediate wire MWL may be a power line. The intermediate wire MWL may transfer the second power voltage ELVSS (see FIG. 3).

In an embodiment, the hole H may be adjacent to the lower hole LH in the second direction (e.g., the x-direction or the (−) x-direction). The hole H may be spaced from a corresponding low hole LH in the second direction (e.g., the x-direction or the (−) x-direction). In an embodiment, the hole H may be adjacent to the lower hole LH in the first direction (e.g., the y-direction or the (−) y-direction). The hole H may be spaced from a corresponding low hole LH in the first direction (e.g., the y-direction or the (−) y-direction)

Figure 11B:
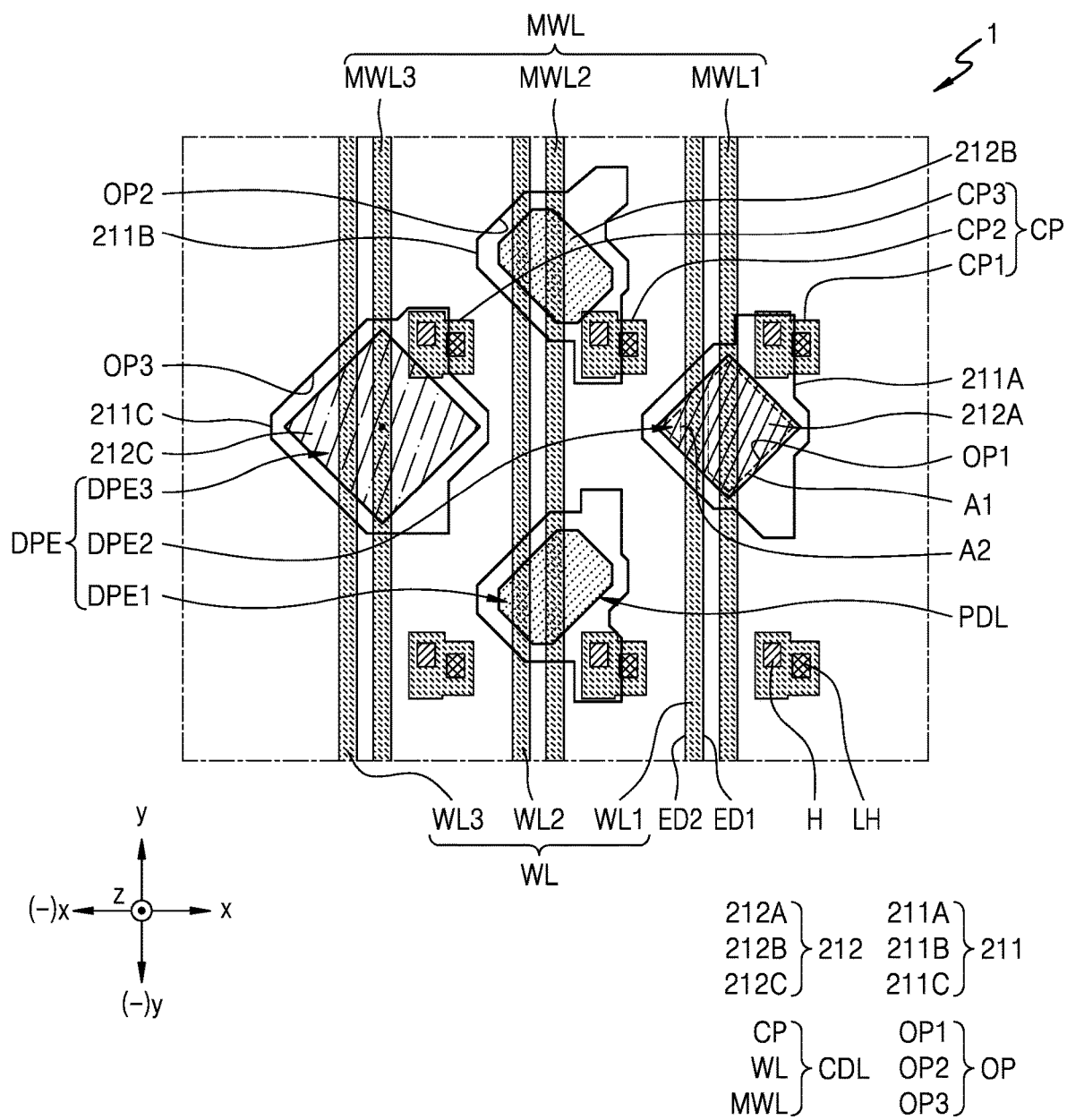
FIG. 11B is an enlarged plan view of a region B of the display apparatus of FIG. 1 according to an embodiment.

FIG. 11B is an enlarged plan view of a region B of the display apparatus 1 of FIG. 1 according to an embodiment. In FIG. 11B, the same reference numerals as those of FIG. 11A may denote the same or similar elements.

Referring to FIG. 11B, the display apparatus 1 may include the conductive layer CDL and the display element DPE. The conductive layer CDL may include the wire WL, the intermediate wire MWL, and the conductive pattern CP.

The wire WL may extend in the first direction (e.g., the y-direction or the (−) y-direction). In the display apparatus 1, the wire WL may be provided in a plurality. In an embodiment, the wire WL may include the first wire WL1, the second wire WL2, and the third wire WL3. The first wire WL1, the second wire WL2, and the third wire WL3 may be spaced from one another in the second direction (e.g., the x-direction or the (−) x-direction) perpendicular to the first direction (e.g., the y-direction or the (−) y-direction).

The wire WL may include the first edge ED1 and the second edge ED2. The first edge ED1 and the second edge ED2 may be edges opposite each other. The first edge ED1 may be an edge in the x-direction from the center WLC of the wire WL. The second edge ED2 may be an edge in the (−) x-direction from the center WLC of the wire WL. In other words, the center WLC of the wire WL may be arranged between the first edge ED1 and the second edge ED2.

The intermediate wire MWL may extend in the first direction (e.g., the y-direction or the (−) y-direction). In the display apparatus 1, the intermediate wire MWL may be provided in a plurality. The intermediate wire MWL may include the first intermediate wire MWL1, the second intermediate wire MWL2, and the third intermediate wire MWL3.

An intermediate wire MWL may be arranged between the conductive pattern CP and the wire WL. An intermediate wire MWL may be arranged between an immediately neighboring conductive pattern CP and an immediately neighboring wire WL. As an example, the first intermediate wire MWL1 may be arranged between the first conductive pattern CP1 and the first wire WL1. The second intermediate wire MWL2 may be arranged between the second conductive pattern CP2 and the second wire WL2. The third intermediate wire MWL3 may be arranged between the third conductive pattern CP3 and the third wire WL3.

One of the wire WL and the intermediate wire MWL may be a power line, and the other of the wire WL and the intermediate wire MWL may be a signal line. One of a wire WL and the immediately neighboring intermediate wire MWL may be a power line, and the other may be a signal line. As an example, the wire WL may be a power line. The wire WL may transfer the second power voltage ELVSS (see FIG. 3). The intermediate wire MWL may be the data line DL (see FIG. 3) configured to transfer a data signal. As another example, the wire WL may be the data line DL (see FIG. 3) configured to transfer a data signal. The intermediate wire MWL may be a power line. The intermediate wire MWL may transfer the second power voltage ELVSS (see FIG. 3).

The conductive pattern CP may transfer an electric signal to the display element DPE. In an embodiment, the conductive pattern CP may overlap the pixel electrode 211 of the display element DPE and may be electrically connected to the pixel electrode 211.

The display element DPE may emit light. The display element DPE may include an organic light-emitting diode. The display element DPE may be electrically connected to the conductive pattern CP through the hole H. The display element DPE may be provided in a plurality, and the plurality of display elements may be electrically connected to the plurality of conductive patterns CP, respectively. The plurality of display elements DPE may include the first display element DPE1, the second display element DPE2, and the third display element DPE3. The first display element DPE1, the second display element DPE2, and the third display element DPE3 may be electrically connected to the first conductive pattern CP1, the second conductive pattern CP2, and the third conductive pattern CP3, respectively. The first display element DPE1 may be a red organic light-emitting diode that emits red light. The second display element DPE2 may be a green organic light-emitting diode that emits green light. The third display element DPE3 may be a blue organic light-emitting diode that emits blue light. The red organic light-emitting diode, the green organic light-emitting diode, and the blue organic light-emitting diode may be arranged in a PENTILE™ structure. The third display element DPE3 may be spaced from the first display element DPE1 in the (−) x-direction of FIG. 5.

Figure 12A:
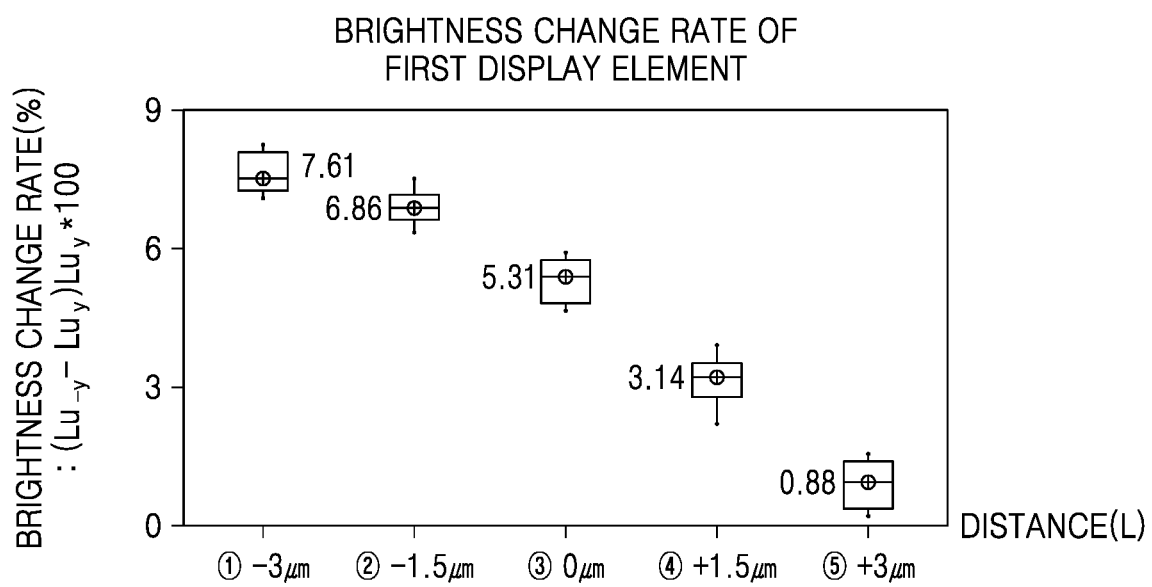
FIG. 12A is a graph showing a brightness change rate of a first display element according to a distance between the center of a first wire and the center of a first opening.
Figure 12B:
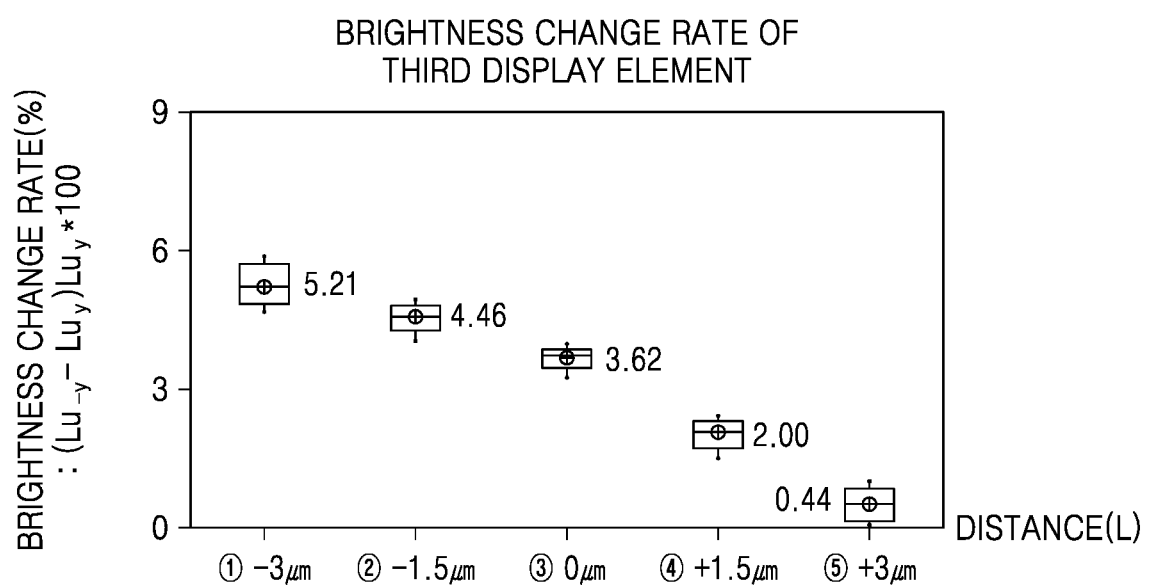
FIG. 12B is a graph showing a brightness change rate of a third display element according to a distance between the center of a third wire and the center of a third opening.

FIG. 12A is a graph showing a brightness change rate of a first display element according to a distance between the center of a first wire and the center of a first opening. FIG. 12B is a graph showing a brightness change rate of a third display element according to a distance between the center of a third wire and the center of a third opening.

Referring to FIGS. 12A and 12B, a brightness change rate of a display element may vary according to a distance between the center of a wire and the center of an overlapping or corresponding opening. The distance between the center of the wire and the center of the opening may correspond to a reference character L of FIG. 5 or a reference character L of FIG. 10. When the distance between the center of the wire and the center of the opening is a positive number, the second area A2 is larger than the first area A1. When the distance between the center of the wire and the center of the opening is a negative number, the second area A2 is smaller than the first area A1.

A brightness change rate is a value representing an amount of change $Lu_{-y}-Lu_y$ between the brightness $Lu_y$ of a display element of the display apparatus 1 of FIG. 5 when viewed in the (−) y-direction with respect to a brightness $Lu_{-y}$ of the display element of the display apparatus 1 of FIG. 5 when viewed in the y direction.

Referring to FIG. 12A, when a distance between the center of the first wire and the center of the first opening increases in a positive direction, a brightness change rate of the first display element is reduced. In other words, when a distance between the first wire and the first conductive pattern increases in a positive direction, a brightness change rate of the first display element may be reduced.

Referring to FIG. 12B, when a distance between the third wire and the third opening increases in a positive direction, a brightness change rate of the third display element may be reduced. In other words, when a distance between the third wire and the third conductive pattern increases in a positive direction, a brightness change rate of the third display element may be reduced.

Accordingly, when a distance between a display element or an opening that overlaps the display element, and a conductive pattern increases, a color change between an image displayed by the display apparatus viewed from the front of the display apparatus and the image displayed by the display apparatus viewed from the lateral side of the display apparatus may be reduced. In addition, when the width of the conductive pattern is reduced, a color change between an image displayed by the display apparatus viewed from the front of the display apparatus and of the image displayed by the display apparatus viewed from the lateral side of the display apparatus may be reduced.

As described above, in the display apparatus according to an embodiment, an opening of the pixel-defining layer may be biased to one side with respect to the center of a wire. Accordingly, a color change between an image displayed by the display apparatus viewed from the front of the display apparatus and the image displayed by the display apparatus viewed from the lateral side of the display apparatus may be reduced.

The described example embodiments should be considered in an illustrative sense and not for purposes of limitation. Features in each embodiment may be available for other embodiments. Various changes in form and details may be made in the example embodiments without departing from the scope defined by the following claims.

What is claimed is:

1. A display apparatus, comprising:
a conductive layer arranged over the substrate and including a wire and a conductive pattern, the wire having a first edge and a second edge and extending in a first direction, and the conductive pattern being arranged outside the first edge of the wire;
an organic insulating layer arranged on the conductive layer and including a hole that overlaps the conductive pattern;
a display element arranged on the organic insulating layer, electrically connected to the conductive pattern through the hole, and including a pixel electrode, an emission layer, and an opposite electrode; and
a pixel-defining layer covering an edge of the pixel electrode, overlapping the wire, and including an opening in which the emission layer is arranged,
wherein the opening is divided by the wire into a first area and a second area in a plan view of the display apparatus, the first area overlapping an outer side of the first edge of the wire, and the second area overlapping an outer side of the second edge of the wire, and the second area is larger than the first area.

2. The display apparatus of claim 1, further comprising:
a thin-film transistor arranged between the substrate and the conductive layer; and
a lower organic insulating layer arranged between the thin-film transistor and the conductive layer and including a lower hole that overlaps at least a portion of the thin-film transistor,
wherein the conductive pattern is electrically connected to the thin-film transistor through the lower hole.

3. The display apparatus of claim 2, wherein the hole is adjacent to the lower hole in the first direction.

4. The display apparatus of claim 2, wherein the hole is adjacent to the lower hole in a second direction, the second direction is perpendicular to the first direction.

5. The display apparatus of claim 1, wherein a first distance from an upper surface of the substrate to a first portion of an upper surface of the organic insulating layer is greater than a second distance from the upper surface of the substrate to a second portion of the upper surface of the organic insulating layer,
the first portion overlaps the conductive pattern, and the second portion does not overlap the conductive pattern, and
the pixel electrode is arranged along a shape of the upper surface of the organic insulating layer.

6. The display apparatus of claim 1, wherein the opening includes a first opening and a second opening,
the conductive pattern includes a first conductive pattern and a second conductive pattern, the first conductive pattern being adjacent to the first opening, and the second conductive pattern being adjacent to the second opening, and
the first conductive pattern and the second conductive pattern are arranged in a second direction, the second direction is perpendicular to the first direction.

7. The display apparatus of claim 6, wherein the second conductive pattern is arranged between the first opening and the second opening.

8. The display apparatus of claim 7, wherein the opening further includes a third opening,
the emission layer includes a first emission layer, a second emission layer, and a third emission layer, the first emission layer emitting a red light and overlapping the first opening, the second emission layer emitting a green light and overlapping the second opening, and the third emission layer emitting a blue light and overlapping the third opening,
the conductive pattern further includes a third conductive pattern adjacent to the third opening and arranged with the second conductive pattern in the second direction, and
the third conductive pattern is at least partially arranged between the second opening and the third opening.

9. The display apparatus of claim 1, wherein a distance between a center of the wire to a center of the opening is 3 μm or more in a second direction, the second direction is perpendicular to the first direction.

10. The display apparatus of claim 1, wherein the wire includes a data line.

11. A display apparatus, comprising:
a substrate;
a lower organic insulating layer arranged over the substrate and including a lower hole;
a conductive layer arranged on the lower organic insulating layer and including a wire and a conductive pattern, the wire including a first edge and a second edge and extending in a first direction, and the conductive pattern being arranged outside the first edge of the wire, overlapping the lower hole, and extending to an upper surface of the lower organic insulating layer from the lower hole;

an organic insulating layer arranged on the conductive layer and including a hole overlapping the conductive pattern;

a display element arranged on the insulating layer, electrically connected to the conductive pattern through the hole, and including a pixel electrode, an emission layer, and an opposite electrode; and a pixel-defining layer covering an edge of the pixel electrode, overlapping the wire, and including an opening in which the emission layer is arranged, wherein the opening is divided by the wire into a first area and a second area in a plan view of the display apparatus, the first area overlapping an outer side of the first edge of the wire, and the second area overlapping an outer side of the second edge of the wire, and the second area is larger or smaller than the first area.

12. The display apparatus of claim 11, wherein the second area is larger than the first area.

13. The display apparatus of claim 11, wherein the second area is smaller than the first area.

14. The display apparatus of claim 11, further comprising a thin-film transistor arranged between the substrate and the lower organic insulating layer and overlapping at least a portion of the lower hole, wherein the conductive pattern is electrically connected to the thin-film transistor through the lower hole.

15. The display apparatus of claim 11, wherein the hole is adjacent to the lower hole in the first direction.

16. The display apparatus of claim 11, wherein the hole is adjacent to the lower hole in a second direction, the second direction is perpendicular to the first direction.

17. The display apparatus of claim 11, wherein the opening includes a first opening, a second opening, and a third opening, the emission layer includes a first emission layer, a second emission layer, and a third emission layer, the first emission layer emitting a red light and overlapping the first opening, the second emission layer emitting a green light and overlapping the second opening, and the third emission layer emitting a blue light and overlapping the third opening, the conductive pattern includes a first conductive pattern, a second conductive pattern, and a third conductive pattern, the first conductive pattern being adjacent to the first opening, the second conductive pattern being adjacent to the second opening, and the third conductive pattern being adjacent to the third opening, the first conductive pattern, the second conductive pattern, and the third conductive pattern are arranged in a second direction, the second direction is perpendicular to the first direction, the second conductive pattern is arranged between the first opening and the second opening, and the third conductive pattern is at least partially arranged between the second opening and the third opening.

18. The display apparatus of claim 11, wherein the conductive layer further includes an intermediate wire extending in the first direction between the conductive pattern and the wire.

19. The display apparatus of claim 18, wherein one of the wire and the intermediate wire includes a power line, and the other of the wire and the intermediate wire includes a data line.

20. The display apparatus of claim 11, wherein the wire includes a data line.

* * * * *